United States Patent
Shibasaki

(10) Patent No.: US 9,614,531 B1
(45) Date of Patent: Apr. 4, 2017

(54) TERMINATION RESISTANCE ADJUSTMENT CIRCUIT AND DEVICE INCLUDING TERMINATION RESISTANCE ADJUSTMENT CIRCUIT

(71) Applicant: FUJITSU LIMITED, Kawasaki-shi, Kanagawa (JP)

(72) Inventor: Takayuki Shibasaki, Kawasaki (JP)

(73) Assignee: FUJITSU LIMITED, Kawasaki-Shi (JP)

( * ) Notice: Subject to any disclaimer, the term of this patent is extended or adjusted under 35 U.S.C. 154(b) by 0 days.

(21) Appl. No.: 15/287,293

(22) Filed: Oct. 6, 2016

(30) Foreign Application Priority Data

Oct. 13, 2015 (JP) ................................. 2015-202035

(51) Int. Cl.
*H03K 19/00* (2006.01)
*H03K 19/0948* (2006.01)
*H04L 25/02* (2006.01)

(52) U.S. Cl.
CPC ..... *H03K 19/0948* (2013.01); *H03K 19/0005* (2013.01); *H04L 25/0278* (2013.01)

(58) Field of Classification Search
CPC ........... H03K 19/0005; H03K 19/0948; H03K 19/017545; H04L 25/0278
See application file for complete search history.

(56) References Cited

U.S. PATENT DOCUMENTS

| 2007/0096720 | A1  | 5/2007  | Clements et al. |
| 2008/0054937 | A1* | 3/2008  | Kinoshita ............ G11C 7/1051 326/30 |
| 2008/0284467 | A1* | 11/2008 | Koo ........................ G11O 5/063 326/30 |
| 2013/0088258 | A1* | 4/2013  | Yokou ..................... G11C 5/147 326/30 |
| 2015/0115999 | A1* | 4/2015  | Lee ................... H03K 19/01754 326/30 |
| 2016/0134285 | A1* | 5/2016  | Ha .................... H03K 19/00369 326/30 |

FOREIGN PATENT DOCUMENTS

JP    2007-121288    5/2007

* cited by examiner

*Primary Examiner* — Don Le
(74) *Attorney, Agent, or Firm* — Staas & Halsey LLP

(57) ABSTRACT

A termination resistance adjustment circuit includes a replica circuit having the same characteristics as drive circuits; a current source being able to adjust the amount of a load current of the replica circuit; a voltage generation circuit to generate a plurality of reference voltages respectively corresponding to a plurality of values of the input data with the plurality of bits; a comparison circuit to compare an output voltage of the replica circuit with the reference voltages; and a control circuit to change the amount of the load current by controlling the current source, to calculate values of the output resistances of the replica circuit for each of the plurality of levels, and to adjust the number of use of the drive circuits for each bit of the input data, based on the calculated values of the output resistances for each of the plurality of levels.

7 Claims, 9 Drawing Sheets

FIG. 6

| OUTPUT RESISTANCE OF PSEUDO CIRCUIT IN EACH OUTPUT LEVEL OF MONITORING VOLTAGE VMON | NUMBER OF USE OF DRIVE CIRCUIT |
|---|---|
| VMON = 5/12 * VDD (CORRESPOND TO D1, D0 = 10) ⇨ RMP1 = (7/12 * VDD)/(I0 * ISTN1) ⋯ (1) <br> VMON = 7/12 * VDD (CORRESPOND TO D1, D0 = 01) ⇨ RMP2 = (5/12 * VDD)/(I0 * ISTN2) ⋯ (2) <br> VMON = 9/12 * VDD (CORRESPOND TO D1, D0 = 00) ⇨ RMP3 = (3/12 * VDD)/(I0 * ISTN3) ⋯ (3) <br> VMON = 7/12 * VDD (CORRESPOND TO D1, D0 = 01) ⇨ RMN1 = (7/12 * VDD)/(I0 * ISTP1) ⋯ (4) <br> VMON = 5/12 * VDD (CORRESPOND TO D1, D0 = 10) ⇨ RMN2 = (5/12 * VDD)/(I0 * ISTP2) ⋯ (5) <br> VMON = 3/12 * VDD (CORRESPOND TO D1, D0 = 11) ⇨ RMN3 = (3/12 * VDD)/(I0 * ISTP3) ⋯ (6) | COMBINATION OF D0 = 0 <br> (RMP3/PTE0 + RMP1/PTE0)/2 = 150 ⋯ (7) <br> ⇩ PTE0 = (RMP3 + RMP1)/300 ⋯ (8) <br><br> COMBINATION OF D1 = 0 <br> (RMP3/PTE1 + RMP2/PTE1)/2 = 75 ⋯ (9) <br> ⇩ PTE1 = (RMP3 + RMP2)/150 ⋯ (10) <br><br> COMBINATION OF D0 = 1 <br> (RMN3/NTE0 + RMN1/NTE0)/2 = 150 ⋯ (11) <br> ⇩ NTE0 = (RMN3 + RMN1)/300 ⋯ (12) <br><br> COMBINATION OF D1 = 1 <br> (RMN3/NTE1 + RMN2/NTE1)/2 = 75 ⋯ (13) <br> ⇩ NTE1 = (RMN3 + RMN2)/150 ⋯ (14) |

\* I0 IS CURRENT PER STEP OF CONTROL SIGNAL CNTIP AND CNTIN, PTE0 AND NTE0 ARE NUMBER OF USE OF DRIVE CIRCUIT 80, PTE1 AND NTE1 ARE NUMBER OF USE OF DRIVE CIRCUIT 81

TERMINATION RESISTANCE ADJUSTMENT CIRCUIT AND DEVICE INCLUDING TERMINATION RESISTANCE ADJUSTMENT CIRCUIT

CROSS-REFERENCE TO RELATED APPLICATION

This application is based upon and claims the benefit of priority of the prior Japanese Patent Application No. 2015-202035, filed on Oct. 13, 2015, the entire contents of which are incorporated herein by reference.

FIELD

The embodiments discussed herein are related to a termination resistance adjustment circuit and a device including the termination resistance adjustment circuit.

BACKGROUND

Termination resistance for reducing reflection of a signal is provided in an output terminal of a transmission circuit and a receiving terminal of a receiving circuit which are used for transmitting data. A value of the termination resistance is specified by standard or the like. The value of the termination resistance can be changed by operation conditions such as temperature. Accordingly, a device is proposed which corrects a value of termination resistance of a transmission circuit or the like so as to be included within a predetermined range (for example, Japanese Laid-open Patent Publication No. 2007-121288). For example, the device generates a control signal that adjusts output impedance of a device to be inspected, based on comparison results of an output voltage of the device to be inspected which duplicates a portion of the transmission circuit and a reference voltage. The control signal that adjusts the output impedance of the device to be inspected is also provided in the transmission circuit. Thereby, the output impedance of the transmission circuit is also adjusted.

As performance of a basic device or the like of an information processing device and a communication system of a server or the like has been increased recently, it is preferable to increase a data rate of transmission and reception of a signal in the inside and outside of a device. Multi-level transmission which uses amplitude modulation is known as a method of increasing the data rate per signal line. For example, a transmission circuit which uses 4-level pulse amplitude modulation (4PAM) includes a drive unit for a higher bit of data with two bits and a drive unit for a lower bit thereof. In addition, the transmission circuit performs amplitude modulation of the data with two bits, and transmits a signal (symbol) including any one of four voltage levels to a receiving circuit through one signal line. The receiving circuit detects a signal with two bits (for example, 00, 01, 10, or 11) from the one symbol. Accordingly, the transmission circuit which performs amplitude modulation of data with a plurality of bits and transmits the data through one signal line can increase a data rate per signal line, compared to a transmission circuit which transmits data with one bit through one signal line.

A difference between each voltage level which is output from the transmission circuit is specified by standard, and is designed to be included in a predetermined range. In a transmission circuit which uses 4PAM, for example, in a case where a value of termination resistance included in a drive unit for a lower bit is double of a value of termination resistance included in a drive unit for a higher bit thereby being stabilized, the differences between each voltage level which are output from the transmission circuit are equal to each other.

In a case where on-resistance or the like of a metal oxide semiconductor (MOS) transistor is used as termination resistance (termination resistance included in each drive unit) of the transmission circuit, an output voltage of the transmission circuit changes, and thereby a value of the termination resistance can change. That is, the value of the termination resistance of the transmission circuit can vary depending on patterns of input data to the transmission circuit.

Accordingly, although the value of the termination resistance at a specific voltage level (specific operation point) is adjusted to be included in a predetermined range, a ratio between a value of termination resistance included in the drive unit for a lower bit and a value of termination resistance included in the drive unit for a higher bit is not appropriately adjusted. The more ratio between the value of the termination resistance included in the drive unit for a lower bit and the value of the termination resistance included in the drive unit for a higher bit deviates from an appropriate value, the more variation of the difference between each voltage level of the voltages which are output from the transmission circuit increases, and characteristics of a transmission waveform is degraded.

According to one aspect, a termination resistance adjustment circuit and a device including the termination resistance adjustment circuit of the present disclosure aims to appropriately adjust the value of the termination resistance of the transmission circuit.

SUMMARY

According to an aspect of the invention, a termination resistance adjustment circuit configured to adjust values of termination resistances of a transmission circuit including a plurality of drive circuits generating output signals with a plurality of voltage levels respectively corresponding to values of an input data with a plurality of bits, by adjusting the number of use of the drive circuits corresponding to each bit of the input data with the plurality of bits, and the termination resistance adjustment circuit includes; a replica circuit having the same characteristics as drive circuits; a current source being able to adjust the amount of a load current of the replica circuit; a voltage generation circuit to generate a plurality of reference voltages respectively corresponding to a plurality of values of the input data with the plurality of bits; a comparison circuit to compare an output voltage of the replica circuit with the reference voltages; and a control circuit to change the amount of the load current by controlling the current source, to calculate values of the output resistances of the replica circuit for each of the plurality of levels, and to adjust the number of use of the drive circuits for each bit of the input data, based on the calculated values of the output resistances for each of the plurality of levels.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a diagram illustrating an example of equations which are used when the number of use of drive circuits is calculated;

DESCRIPTION OF EMBODIMENTS

Hereinafter, embodiments will be described with reference to the drawings.

Figure 1:
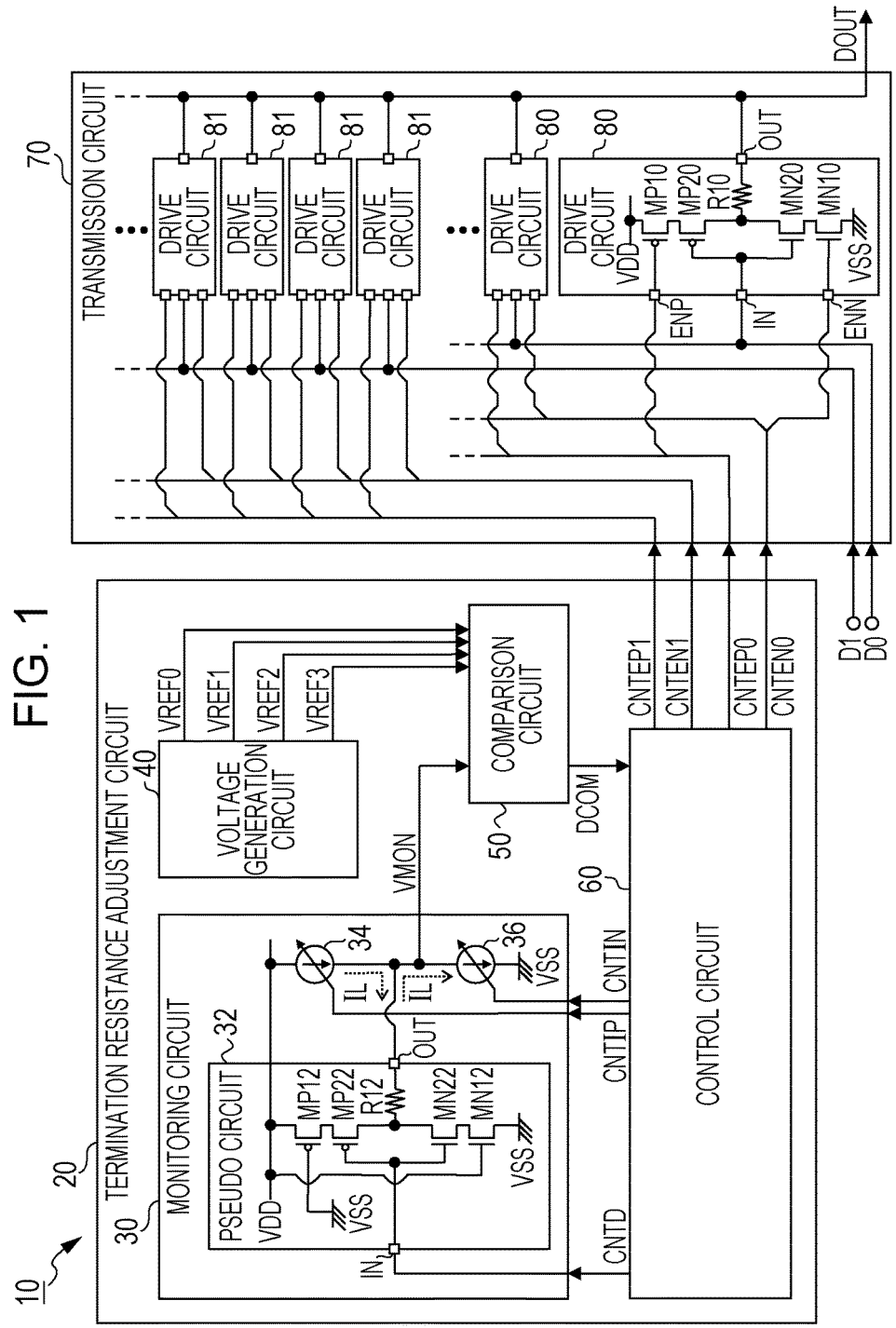
FIG. 1 is a diagram illustrating a termination resistance adjustment circuit and a device including the termination resistance adjustment circuit according to an embodiment.

FIG. 1 illustrates a termination resistance adjustment circuit and a device including the termination resistance adjustment circuit according to an embodiment. The device 10 illustrated in FIG. 1 includes a transmission circuit 70 that generates output signals DOUT of voltage levels corresponding to values of input data D (D1, D0) with two bits, and a termination resistance adjustment circuit 20 that adjusts a value of termination resistance of the transmission circuit 70. The transmission circuit 70 and the termination resistance adjustment circuit 20 are mounted in, for example, an information processing device such as a server, a basic device of a communication system, or the like.

The transmission circuit 70 performs 4PAM that is a amplitude modulation of two bits, and performs an amplitude modulation of the input data D1 and D0 with two bits. Thereby, the transmission circuit 70 can transmit signals of four voltage levels corresponding to each of four values represented by the input data D1 and D0 with two bits, to a reception circuit through one signal line. A signal of 4PAM is generated by adding the data D0 of a lower bit to the data D1 of a higher bit among the input data D with two bits, at a ratio of 1:2.

For example, the transmission circuit 70 includes a plurality of drive circuits 80 that receive the input data D0, and a plurality of drive circuits 81 that receive the input data D1. In FIG. 1, illustration of internal elements (for example, a P-type MOS transistor MP10 or the like) and terminal names of the drive circuits 80 and 81 is omitted except for one, so as to make it easy to view the figure.

In the plurality of drive circuits 80, input terminals IN connected to each other receive the input data D0, each terminal ENP receives control signals CNTEP0 independent from each other, and each terminal ENN receives control signals CNTEN0 independent from each other. In FIG. 1, the control signals CNTEP0 independent from each other are denoted by one signal line, and the control signals CNTEN0 independent from each other are denoted by one signal line, so as to make it easy to view the figure. Each of the plurality of drive circuits 80 is set to a drivable state or an undrivable state, based on the control signal CNTEP0 received by the terminal ENP and the control signal CNTEN0 received by the terminal ENN. The drivable drive circuit 80 drives an output terminal OUT, based on a level (value) of the input data D0 received by an input terminal IN.

For example, each drive circuit 80 includes P-type MOS transistors MP10, MP20, N-type MOS transistors MN10 and MN20, and a resistor R10. Hereinafter, the P-type MOS transistor and the N-type MOS transistor are simply referred to as transistors.

The transistors MP10, MP20, MN20, and MN10 are connected in series between a power supply line (hereinafter, also referred to as a power supply line VDD) to which a power supply voltage VDD is supplied, and a ground line (hereinafter, also referred to as a ground line VSS) to which a ground voltage VSS is supplied. A gate of the transistor MP10 is connected to the terminal ENP, gates of the transistors MP20 and MN20 are connected to the input terminal IN, and a gate of the transistor MN10 is connected to the terminal ENN. Drains of the transistors MP20 and MN20 are connected to one terminal of the resistor R10. The other terminal of the resistor R10 is connected to the output terminal OUT.

The gate of the transistor MP10 receives the control signal CNTEP0 through the terminal ENP, and the transistor MP10 is turned on (conduction state) or is turned off (non-conduction state), according to a value (level) of the received control signal CNTEP0. In addition, the gate of the transistor MN10 receives the control signal CNTEN0 through the terminal ENN, and the transistor MN10 is turned on or off, according to a value (level) of the received control signal CNTEN0.

For example, in the drive circuit 80 in which the terminal ENP is set to a logic low level (for example, "0"), the transistor MP10 is turned on, and in the drive circuit 80 in which the terminal ENN is set to a logic high level (for example, "1"), the transistor MN10 is turned on. In addition, in the drive circuit 80 in which the input terminal IN receives input data D0 with a logic low level, the transistor MP20 is turned on and the transistor MN20 is turned off. In addition, in the drive circuit 80 in which the input terminal IN receives input data D0 with a logic high level, the transistor MP20 is turned off and the transistor MN20 is turned on.

Hence, the drive circuit 80 which receives the control signal CNTEP0 with a logic low level is set to a state (drivable state) which is driven when receiving the input data D0 with a logic low level. That is, in the drive circuit 80 which is driven in a case where the input data D0 with a logic low level is received, the corresponding control signal CNTEP0 is set to a logic low level. In other words, in the drive circuit 80 which is not driven in a case where the input data D0 with a logic low level is received, the corresponding control signal CNTEP0 is set to a logic high level.

In addition, the drive circuit 80 which receives the control signal CNTEN0 with a logic high level is set to a state (drivable state) which is driven when receiving the input data D0 with a logic high level. That is, in the drive circuit 80 which is driven in a case where the input data D0 with a logic high level is received, the corresponding control signal CNTEN0 is set to a logic high level. In other words, in the drive circuit 80 which is not driven in a case where the input data D0 with a logic high level is received, the corresponding control signal CNTEN0 is set to a logic low level. Accordingly, the number of use of the drive circuit 80 is controlled by the controls signal CNTEP which is transmitted to the terminal ENP and the controls signal CNTEN which is transmitted to the terminal ENN.

For example, in a case where the input terminal IN receives the input data D0 with a logic low level, the drive circuit 80 whose terminal ENP is set to a logic low level connects the power supply line VDD to the output terminal OUT, and disconnects the ground line VSS from the output terminal OUT. In this case, the transistors MP10 and MP20 and the resistor R10 which are disposed between the power supply line VDD and the output terminal OUT function as termination resistance of the drive circuit 80. For example, a value of the termination resistance of the drive circuit 80 is a value of a combined resistance which is obtained by combining an on-resistance of the transistor MP10, an on-resistance of the transistor MP20, and the resistor R10. In the drive circuit 80 whose terminal ENP is set to a logic high level, the transistor MP10 is turned off, and thus, the transistors MP10 and MP20 do not function as termination resistance, even in a case where the input data D0 has a logic low level.

For example, in a case where the input terminal IN receives the input data D0 with a logic high level, the drive circuit 80 whose terminal ENN is set to a logic high level disconnects the power supply line VDD from the output terminal OUT, and connects the ground line VSS to the output terminal OUT. In this case, the transistors MN10 and MN20 and the resistor R10 which are disposed between the ground line VSS and the output terminal OUT function as termination resistance of the drive circuit 80. For example, a value of the termination resistance of the drive circuit 80 is a value of a combined resistance which is obtained by combining an on-resistance of the transistor MN10, an on-resistance of the transistor MN20, and the resistor R10. In the drive circuit 80 whose terminal ENN is set to a logic low level, the transistor MN10 is turned off, and thus, the transistors MN10 and MN20 do not function as a termination resistance, even in a case where the input data D0 has a logic high level.

Since the output terminals OUT of the plurality of drive circuits 80 are connected to each other, the termination resistances of the plurality of drive circuits 80 are connected to each other. In addition, the drive circuit 80 which is set to a state which is not driven although the input data D0 with a logic low level is received maintains the power supply line VDD to be disconnected from the output terminal OUT, regardless of a level of the input data D0 received by the input terminal IN. In the same manner, the drive circuit 80 which is set to a state which is not driven although the input data D0 with a logic high level is received maintains the ground line VSS to be disconnected from the output terminal OUT, regardless of the level of the input data D0 received by the input terminal IN.

Accordingly, a combined value of the termination resistances of the plurality of drive circuits 80 connected in parallel with each other is equal to a value of the combined resistances which are obtained by connecting the termination resistances of the drive circuits 80 in drivable state parallel with each other. Hereinafter, the combined resistances which are obtained by connecting the termination resistances of the drive circuits 80 in a drivable state parallel with each other is referred to as a combined resistance of the drive circuits 80. The combined resistance of the plurality of drive circuits 80 functions as a part of the termination resistance of the transmission circuit 70. Hence, as the number (that is, the number of use of the drive circuits 80) of the drive circuits 80 in a drivable state is adjusted, it is possible to adjust a value of the termination resistance of the transmission circuit 70.

The drive circuits 81 are the same as the drive circuits 80, except that input data D1 and control signals CNTEP1 and CNTEN1 are received instead of the input data D0 and the control signals CNTEP0 and CNTEN0. For example, in a case where the input terminal IN receives the input data D1 with a logic low level, the drive circuit 81 whose terminal ENP is set to a logic low level connects the power supply line VDD to the output terminal OUT, and disconnects the ground line VSS from the output terminal OUT. In this case, the transistors MP10 and MP20 and the resistor R10 which are disposed between the power supply line VDD and the output terminal OUT function as termination resistance of the drive circuit 81.

In addition, in a case where the input terminal IN receives the input data D1 with a logic high level, the drive circuit 81 whose terminal ENN is set to a logic high level disconnects the power supply line VDD from the output terminal OUT, and connects the ground line VSS to the output terminal OUT. In this case, the transistors MN10 and MN20 and the resistor R10 which are disposed between the ground line VSS and the output terminal OUT function as termination resistance of the drive circuit 81. Hereinafter, the combined resistances which are obtained by connecting the termination resistances of the drive circuits 81 in a drivable state parallel with each other are referred to as a combined resistance of the drive circuits 81. The combined resistance of the drive circuits 81 functions as a part of the termination resistance of the transmission circuit 70. Hence, as the number (that is, the number of use of the drive circuits 81) of the drive circuits 81 in a drivable state is adjusted, it is possible to adjust a value of the termination resistance of the transmission circuit 70.

The output terminals OUT of the drive circuits 80 are connected to the output terminals OUT of the drive circuits 81. Hence, a value of the termination resistance of the transmission circuit 70 is a value of the combined resistance which is obtained by connecting the combined resistance of the drive circuits 80 in parallel to the combined resistance of the drive circuits 81. That is, the value of the termination resistance of the transmission circuit 70 is adjusted by adjusting the number of use of the drive circuits 81 and 80 for each bit of the input data D (D1 and D0) with two bits.

The transistors MP and MN which function as termination resistances are switched by a value of the input data D1 and D0. For example, in a case where the input data D1 and D0 are "00", the transistors MP10 and MP20 and the resistor R10 in the drive circuits 81 and 80 function as the termination resistance of the transmission circuit 70. In a case where the input data D1 and D0 are "01", the transistors MP10 and MP20 and the resistor R10 in the drive circuits 81 and the transistors MN10 and MN20 and the resistor R10 in the drive circuits 80 function as the termination resistance of the transmission circuit 70. In a case where the input data D1 and D0 are "10", the transistors MN10 and MN20 and the resistor R10 in the drive circuits 81 and the transistors MP10 and MP20 and the resistor R10 in the drive circuits 80 function as the termination resistance of the transmission circuit 70. In a case where the input data D1 and D0 are "11", the transistors MN10 and MN20 and the resistor R10 in the drive circuits 81 and 80 function as the termination resistance of the transmission circuit 70.

In addition, in a case where the voltage level (voltage of the output terminal OUT) of output signal DOUT changes, the values of the on-resistances of the MOS transistors (for example, transistors MP10, MP20, MN10, and MN20) can change, and the values of the termination resistances of the respective drive circuits 80 and 81 can change. Accordingly, the value of the termination resistance of the transmission circuit 70 is adjusted by the control signals CNTEP0, CNTEN0, CNTEP1, and CNTEN1 so as to be included in a predetermined range (for example, 50±5Ω or the like) regardless of the value of the input data D1 and D0.

Furthermore, the value of the combined resistance of the drive circuits 80 and the value of the combined resistance of the drive circuits 81 are adjusted such that drive force of the drive circuits 81 for input data D1 is double of drive force of the drive circuits 80 for input data D0. For example, the value of the combined resistance of the drive circuits 80 is adjusted to be approximately double of the value of the combined resistance of the drive circuits 81. In a case where the value of the combined resistance of the drive circuits 80 is double of the value of the combined resistance of the drive circuits 81 regardless of the value of the input data D1 and D0, thereby being stabilized, a difference between the respective voltage levels of the output signal DOUT is equal. For example, four voltage levels corresponding to each of four values which are represented by the input data D1 and D0 with two bits are 9/12*VDD, 7/12*VDD, 5/12*VDD, and 3/12*VDD, thereby being stabilized, and a difference between the four voltage levels is 1/6*VDD. Here, "*" means multiplying.

The value of the termination resistance of the transmission circuit 70 is adjusted by the termination resistance adjustment circuit 20, for example, when the device 10 is manufactured (more specifically, when the device is tested at a manufacturing process) or when power is supplied to the device 10.

The termination resistance adjustment circuit 20 includes, for example, a monitoring circuit 30, a voltage generation circuit 40, a comparison circuit 50, and a control circuit 60. The monitoring circuit 30 includes a replica circuit 32 which includes output resistance with the same characteristics as the termination resistances the drive circuits 80 and 81, and current sources 34 and 36 which supply a load current IL to the output terminal OUT of the replica circuit 32. The output terminal OUT of the replica circuit 32 is connected to the current sources 34 and 36 and the comparison circuit 50.

The replica circuit 32 includes P-type MOS transistors MP22 and MP12, N-type MOS transistors MN12 and MN22, a resistor R12. Electrical characteristics of each of the transistors MP12, MP22, MN12, and MN22 and the resistor R12 are the same as or similar to the electrical characteristics of each of the transistors MP10, MP20, MN10, and MN20 and the resistor R10 of the drive circuit 80. For example, a ratio between a gate length and a gate width of the transistor MP12 coincides with or approximately coincides with a ratio between a gate length and a gate width of the transistor MP10. A ratio between a gate length and a gate width of the transistor MP22 coincides with or approximately coincides with a ratio between a gate length and a gate width of the transistor MP20. A ratio between a gate length and a gate width of the transistor MN12 coincides with or approximately coincides with a ratio between a gate length and a gate width of the transistor MN10. A ratio between a gate length and a gate width of the transistor MN22 coincides with or approximately coincides with a ratio between a gate length and a gate width of the transistor MN20. Electrical characteristics of the resistor R12 are the same as or similar to the electrical characteristics of the resistor R10.

The transistors MP12, MP22, MN12, and MN22 are connected in series between the power supply line VDD and the ground line VSS. A gate of the transistor MP12 is connected to the ground line VSS, thereby being maintained to be turned on. Gates of the transistors MP22 and MN22 are connected to the input terminal IN, and receive control data CNTD from the control circuit 60. In addition, drains of the transistors MP22 and MN22 are connected to one terminal of the resistor R12. The other terminal of the resistor R12 is connected to the output terminal OUT of the replica circuit 32.

As such, the replica circuit 32 is set to a drivable state in advance, and drives the output terminal OUT, based on a level (value) of the control data CNTD received by the input terminal IN. For example, in a case where the input terminal IN receives the control data CNTD with a logic low level, the replica circuit 32 connects the power supply line VDD to the output terminal OUT, and disconnects the ground line VSS from the output terminal OUT. In this case, the load current IL flows from the power supply line VDD to the current source 36 through the transistors MP12 and MP22, the resistor R12, and the output terminal OUT. Hence, the transistors MP12 and MP22 and the resistor R12 which are disposed between the power supply line VDD and the output terminal OUT function as output resistance of the replica circuit 32. For example, a value of the output resistance of the replica circuit 32 is a value of a combined resistance which is obtained by combining an on-resistor of the transistor MP12, an on-resistor of the transistor MP22, the resistor R12.

In addition, for example, in a case where the input terminal IN receives the control data CNTD with a logic high level, the replica circuit 32 disconnects the power supply line VDD from the output terminal OUT, and connects the ground line VSS to the output terminal OUT. In this case, the load current IL flows from the current source 34 to the ground line VSS through the output terminal OUT, the resistor R12, and the transistors MN12 and MN22. Hence, the transistors MN12 and MN22 and the resistor R12 which are disposed between the ground line VSS and the output terminal OUT function as the output resistance of the replica circuit 32. For example, a value of the output resistance of the replica circuit 32 is a value of a combined resistance which is obtained by combining an on-resistor of the transistor MN12, an on-resistor of the transistor MN22, the resistor R12.

The current source 34 adjusts the amount of the load current IL flowing into the output terminal OUT of the replica circuit 32, based on a control signal CNTIP received from the control circuit 60. The current source 36 adjusts the amount of the load current IL flowing out of the output terminal OUT of the replica circuit 32, based on a control signal CNTIN received from the control circuit 60.

The voltage generation circuit 40 generates four reference voltages VREF0, VREF1, VREF2, and VREF3 corresponding to each of four values which are represented by the input data D1 and D0 with two bits that are supplied to the transmission circuit 70. For example, the reference voltage VREF0 corresponds to the voltage level (approximately 9/12*VDD) of the output signal DOUT when the input data D1 and D0 of the transmission circuit 70 is "00". The reference voltage VREF1 corresponds to the voltage level (approximately 7/12*VDD) of the output signal DOUT when the input data D1 and D0 is "01". The reference voltage VREF2 corresponds to the voltage level (approximately 5/12*VDD) of the output signal DOUT when the input data D1 and D0 is "10". The reference voltage VREF3 corresponds to the voltage level (approximately 3/12*VDD) of the output signal DOUT when the input data D1 and D0 is "11". The reference voltages VREF0, VREF1, VREF2, and VREF3 which are generated by the voltage generation circuit 40 are supplied to the comparison circuit 50.

The comparison circuit 50 receives a monitoring voltage VMON which is output from the output terminal OUT of the replica circuit 32, from the monitoring circuit 30, and receives the plurality of reference voltages VREF0, VREF1, VREF2, and VREF3 from the voltage generation circuit 40. The comparison circuit 50 compares the monitoring voltage VMON with each of the plurality of reference voltages VREF0, VREF1, VREF2, and VREF3, and outputs comparison result information DCOM indicating each of the comparison results to the control circuit 60. A magnitude relationship between each of the reference voltages VREF0, VREF1, VREF2, and VREF3 and the monitoring voltage VMON can be seen by the comparison result information DCOM. That is, it can be seen to which the monitoring voltage VMON is close, among the reference voltages VREF0, VREF1, VREF2, and VREF3.

The control circuit 60 drives the replica circuit 32 by setting the control data CNTD to a logic low level or a logic high level, and changes the amount of the load current IL using the control signals CNTIP and CNTIN. For example, in a case where the control data CNTD is set to a logic low level, the control circuit 60 increases the amount of the load current IL flowing out of the output terminal OUT of the replica circuit 32, from zero, until the monitoring voltage VMON decreases to the reference voltage VREF2 or lower. In addition, for example, in a case where the control data CNTD is set to a logic high level, the control circuit 60 increases the amount of the load current IL flowing into the output terminal OUT of the replica circuit 32, from zero, until the monitoring voltage VMON exceeds the reference voltage VREF1.

In addition, the control circuit 60 calculates a value of output resistance of the replica circuit 32 at each of a plurality of levels of the monitoring voltage VMON, based on the amount of the load current IL when the comparison result information DCOM received from the comparison circuit 50 changes. Timing when the comparison result information DCOM changes corresponds to timing when a level of the monitoring voltage VMON which changes according to the change of the amount of the load current IL passes each reference voltage VREF. For example, the control circuit 60 specifies the level of the monitoring voltage VMON when the comparison result information DCOM changes, to any one of the reference voltages VREF0, VREF1, VREF2, and VREF3, based on the comparison results before or after the comparison result information DCOM changes.

In addition, the control circuit 60 calculates the value of the output resistance of the replica circuit 32, based on the amount of the load current IL (amount of current of the current source 34 or the current source 36) when the comparison result information DCOM changes, and the level of the monitoring voltage VMON (specified reference voltage VREF). Thereby, the values of the output resistances of the replica circuit 32 are respectively calculated when the level of the monitoring voltage VMON is one of the reference voltages VREF0, VREF1, VREF2, and VREF3.

As such, the control circuit 60 calculates the values of the output resistances of the replica circuit 32 at each of the four voltage levels respectively corresponding to the values which are represented by the input data D1 and D0 with two bits. In addition, the control circuit 60 adjusts the number of use of the drive circuits 81 and 80 for each bit of the input data D1 and D0 with two bits, based on the values of the output resistances of the replica circuit 32 which are calculated for each of the plurality of levels of the monitoring voltage VMON.

The control circuit 60 sets the number of use of the respective drive circuits 80 and 81 such that a ratio between a value of the combined resistance of the drive circuit 80 and a value of the combined resistance of the drive circuit 81 is 2:1. For example, in a case where a specified value of the termination resistance of the transmission circuit 70 is 50Ω, the value of the combined resistance of the drive circuits 80 is adjusted so as to be 150 (=50*(1+2)) Ω, and the value of the combined resistance of the drive circuits 81 is adjusted so as to be 75 (=50*(1+2)/2) Ω.

For example, the control circuit 60 calculates the number of use of the drive circuits 80 in which an average of the values of the combined resistances of the drive circuits 80 is closest to 150Ω at the plurality of voltage levels corresponding to the plurality of reference voltages VREF. In addition, the control circuit 60 generates the control signals CNTEN0 and CNTEP0 which make the drive circuits 80 of the same number as the calculated number of use enter a drivable state, among the plurality of drive circuits 80. In addition, the control circuit 60 calculates the number of use of the drive circuits 81 in which an average of the values of the combined resistances of the drive circuits 81 is closest to 75Ω at the plurality of voltage levels corresponding to the plurality of reference voltages VREF. In addition, the control circuit 60 generates the control signals CNTEN1 and CNTEP1 which make the drive circuits 81 of the same number as the calculated number of use enter a drivable state, among the plurality of drive circuits 81.

As such, the control circuit 60 adjusts the number of use of the drive circuits 80 and 81 for each bit of the input data D (D1 and D0) with two bits, based on the value of the output resistance of the replica circuit 32 which is calculated for each of the plurality of levels of the monitoring voltage VMON, and adjusts the value of the termination resistance of the transmission circuit 70. Since the plurality of levels of the monitoring voltage VMON at the time of calculating the value of the output resistance of the replica circuit 32 correspond to the plurality of reference voltages VREF, thereby corresponding to a plurality of patterns (hereinafter, also referred to as input patterns) of input data D with two bits.

That is, the termination resistance adjustment circuit 20 separately adjusts the number of use of the drive circuits 81 and 80, using the value of the output resistances of the replica circuit 32 which is calculated by the plurality of input patterns. Thereby, it is possible to appropriately adjust the value of the termination resistance of the transmission circuit 70. For example, variation (variation depending on a change of the input pattern) of the ratio between the value of the combined resistance of the drive circuit 81 and the value of the combined resistance of the drive circuit 80 is reduced compared to a case where the number of use of the drive circuits 80 and 81 is adjusted based on one input pattern.

Configurations (that is, configuration of the device 10) of the termination resistance adjustment circuit 20 and the transmission circuit 70 are not limited to the example illustrated in FIG. 1. For example, the transmission circuit 70 may generate the output signal DOUT by performing an amplitude modulation of the input data D with three bits or more. In this case, the transmission circuit 70 includes a plurality of drive circuits which are the same as or similar to the drive circuits 80 for each bit of the input data D. In addition, the termination resistance adjustment circuit 20 adjusts the number of use of the drive circuits for each bit of the input data D, thereby adjusting the value of the termination resistance of the transmission circuit 70.

In addition, the configurations of the drive circuits 80 and 81 are not limited to the example illustrated in FIG. 1. For example, the drive circuits 80 and 81 may disconnect the power supply line VDD from the output terminal OUT, and may connect the ground line VSS to the output terminal OUT, when the input terminal IN receives the input data D0 with a logic low level. In this case, the drive circuits 80 and 81 may connect the power supply line VDD to the output terminal OUT, and may disconnect the ground line VSS from the output terminal OUT, when the input terminal IN receives the input data D0 with a logic high level.

As described above, in the embodiment illustrated in FIG. 1, the termination resistance adjustment circuit 20 separately adjusts the number of use of the drive circuits 80 and 81, based on the value (value of the output resistance corresponding to the plurality of input patterns) of the output resistance which is calculated for each of the plurality of levels of the monitoring voltage VMON. Variation (variation depending on a change of the input pattern) of the ratio between the value of the combined resistance of the drive circuit 81 and the value of the combined resistance of the drive circuit 80 is reduced compared to a case where the number of use of the drive circuits 80 and 81 is adjusted based on one input pattern. Accordingly, it is possible to suppress an increase (degradation of characteristics of a waveform of a transmitted signal) of variation of a difference between the respective voltage levels of the output signal DOUT which is output from the transmission circuit 70, compared to a case where the number of use of the drive circuits 80 and 81 is adjusted based on one input pattern. In this way, it is possible to appropriately adjust the value of the termination resistance of the transmission circuit 70, in the embodiment of FIG. 1.

Figure 2:
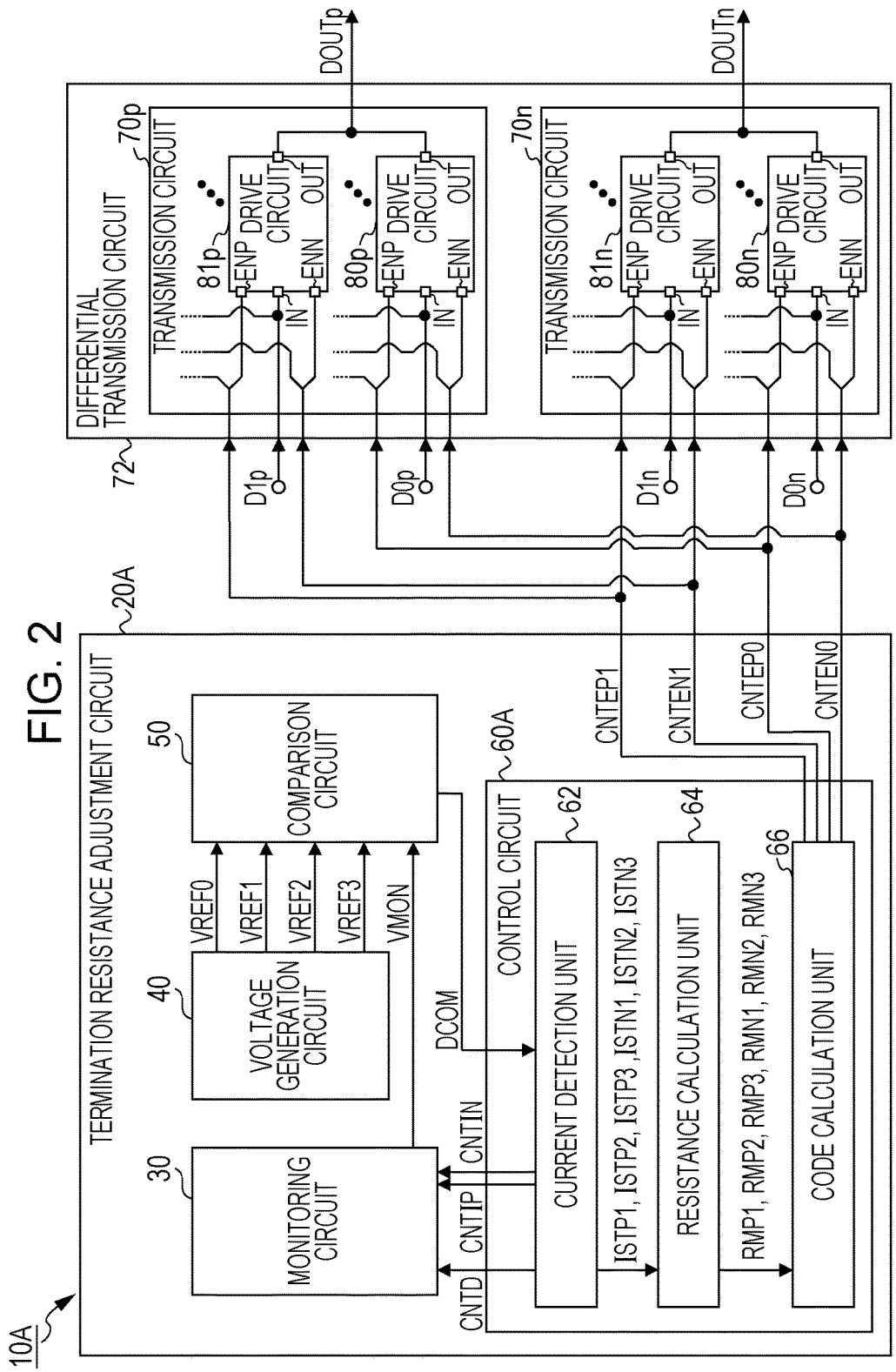
FIG. 2 is a diagram illustrating a termination resistance adjustment circuit and a device including the termination resistance adjustment circuit according to another embodiment.

FIG. 2 illustrates another embodiment of the termination resistance adjustment circuit and the device including the termination resistance adjustment circuit. The same or similar symbols or reference numerals will be attached to the elements which are the same as or similar to the elements illustrated in FIG. 1, and detailed description thereof will be omitted. A device 10A illustrated in FIG. 2 includes a differential transmission circuit 72, and a termination resistance adjustment circuit 20A which adjusts a value of a termination resistance of the differential transmission circuit 72. The differential transmission circuit 72 and the termination resistance adjustment circuit 20A are mounted in, for example, a basic device or the like of an information processing device or a communication system of a server or the like.

The differential transmission circuit 72 receives differential input data D, and outputs differential output signals DOUT (DOUTp and DOUTn) to a receiving device or the like (not illustrated). The input data D0p is an inverted signal of the input data D0n, and the input data D1p is an inverted signal of the input data D1n. For example, the differential transmission circuit 72 includes transmission circuits 70n and 70p. Configurations of the transmission circuits 70n and 70p are the same as or similar to the configuration of the transmission circuit 70 illustrated in FIG. 1.

The transmission circuit 70n performs 4PAM, and generates an output signal DOUTn of a voltage level corresponding to values of the input data D1n and D0n with two bits. For example, the transmission circuit 70n includes a plurality of drive circuits 80n which receive the input data D0n, and a plurality of drive circuits 81n which receive the input data D1n. The drive circuits 80n is the same as or similar to the drive circuits 80 illustrated in FIG. 1, except that the input data D0n is received instead of the input data D0 illustrated in FIG. 1. The drive circuits 81n is the same as or similar to the drive circuits 81 illustrated in FIG. 1, except that the input data D1n is received instead of the input data D1 illustrated in FIG. 1.

The transmission circuit 70p performs 4PAM, and generates an output signal DOUTp of a voltage level corresponding to values of the input data D1p and D0p with two bits. For example, the transmission circuit 70p includes a plurality of drive circuits 80p which receive the input data D0p, and a plurality of drive circuits 81p which receive the input data D1p. The drive circuits 80p is the same as or similar to the drive circuits 80 illustrated in FIG. 1, except that the input data D0p is received instead of the input data D0 illustrated in FIG. 1. The drive circuits 81p is the same as or similar to the drive circuits 81 illustrated in FIG. 1, except that the input data D1p is received instead of the input data D1 illustrated in FIG. 1.

A value of termination resistance of the transmission circuit 70n is adjusted by adjusting the number of use of the drive circuits 81n and 80n for each bit of the input data D (D1n and D0n) with two bits. In the example illustrated in FIG. 2, the number of use of the drive circuits 80p is adjusted to have the same number as the number of use of the drive circuits 80n, and the number of use of the drive circuits 81p is adjusted to have the same number as the number of use of the drive circuits 81n. Here, the drive circuits 80n and 80p are also referred to as drive circuits 80, and the drive circuits 81n and 81p are also referred to as drive circuits 81.

The termination resistance adjustment circuit 20A includes, for example, a monitoring circuit 30, a voltage generation circuit 40, a comparison circuit 50, and a control circuit 60A. The monitoring circuit 30, the voltage generation circuit 40, and the comparison circuit 50 are the same as or similar to the monitoring circuit 30, the voltage generation circuit 40, and the comparison circuit 50 which are illustrated in FIG. 1.

The control circuit 60A includes a current detection unit 62, a resistance calculation unit 64, and a code calculation unit 66. The current detection unit 62 outputs control data CNTD, and control signals CNTIP and CNTIN to the monitoring circuit 30, and receives the comparison result information DCOM from the comparison circuit 50. For example, the current detection unit 62 drives the replica circuit 32 in the monitoring circuit 30 illustrated in FIG. 4 by setting the control data CNTD to have a logic low level or a logic high level. In addition, the current detection unit 62 changes the amount of the load current IL by controlling the current sources 34 and 36 in the monitoring circuit 30 illustrated in FIG. 4, using the control signals CNTIP and CNTIN.

In addition, the current detection unit 62 outputs current information IST (ISTP1, ISTP2, ISTP3, ISTN1, ISTN2, and ISTN3) indicating the amount of the load current IL when the comparison result information DCOM received from the comparison circuit 50 changes, to the resistance calculation unit 64. A detailed operation of the current detection unit 62 will be described with reference to FIG. 5.

The resistance calculation unit 64 calculates a value of the output resistance of the replica circuit 32 for each of a plurality of levels of the monitoring voltage VMON, based on the current information IST received from the current detection unit 62. In addition, the resistance calculation unit 64 outputs resistance information RMP (RMP1, RMP2, and RMP3), and RMN (RMN1, RMN2, and RMN3) which indicate the value of the output resistances of the replica circuit 32 calculated for each of the plurality of levels of the monitoring voltage VMON, to the code calculation unit 66. A method of calculating the resistance information RMP and RMN will be described with reference to FIG. 6.

The code calculation unit 66 generates control signals CNTE (CNTEN0, CNTEN1, CNTEP0, and CNTEP1), based on the resistance information RMP and RMN received from the resistance calculation unit 64. For example, the code calculation unit 66 calculates the number (the number of the drive circuits 80 and 81 in a drivable state) of use of the drive circuits 80 and 81, based on the resistance information RMP and RMN for each bit of input data D with two bits. In addition, the code calculation unit 66 generates the control signals CNTE that enable the drive circuits 80 and 81 which are the same number as the calculated number of use to enter a drivable state, and outputs the generated the control signals CNTE to the differential transmission circuit 72. A method of calculating the number of use of the drive circuits 80 and 81 will be described with reference to FIG. 6.

Configurations (that is, configuration of the device 10A) of the termination resistance adjustment circuit 20A and the differential transmission circuit 72 are not limited to the example illustrated in FIG. 2. For example, the respective transmission circuits 70 (70n and 70p) may generate the output signals DOUT by performing an amplitude modulation of the input data D with three bits or more. In this case, the transmission circuit 70 includes a plurality of drive circuits which are the same as or similar to the drive circuits 80n for each bit of the input data D. In addition, the termination resistance adjustment circuit 20A adjusts the number of use of the drive circuits for each bit of the input data D, and adjusts values of the termination resistances of each transmission circuit 70. In addition, the device 10A may include a transmission circuit (circuit in which one of the transmission circuits 70n and 70p is omitted from the differential transmission circuit 72) of a single-ended input, instead of the differential transmission circuit 72.

Figure 3:
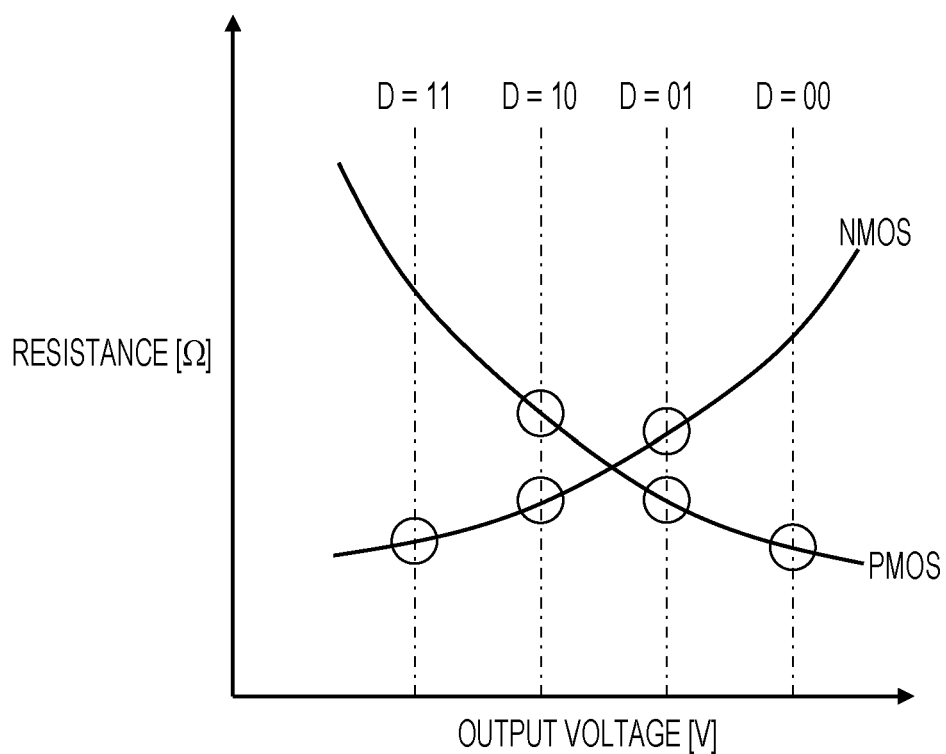
FIG. 3 is a diagram illustrating an example of characteristics of on-resistance of a MOS transistor.

FIG. 3 illustrates an example of characteristics of the on-resistance of the MOS transistor. A horizontal axis of FIG. 3 denotes an output voltage (voltage level of the output signals DOUT), and a vertical axis of FIG. 3 denotes the value of the on-resistance of the MOS transistor such as the transistor MP10, MP20, MN10, or MN20 illustrated in FIG. 1. Alternate long and short dash lines of FIG. 3 denote output voltages corresponding to each input pattern (11, 10, 01, and 00) of the input data D with two bits. The higher the output voltage is, the more the on-resistance (PMOS transistor illustrated in FIG. 3) of the P-type MOS transistor decreases, and the higher the output voltage is, the more the on-resistance (NMOS transistor illustrated in FIG. 3) of the N-type MOS transistor increases. Hence, in a case where voltage levels (output voltages) of the output signals DOUT change, values of the on-resistances of the MOS transistors (for example, the transistors MP10, MP20, MN10, and MN20) can change, and the values of the termination resistances of the respective drive circuits 80 and 81 can change.

Figure 4:
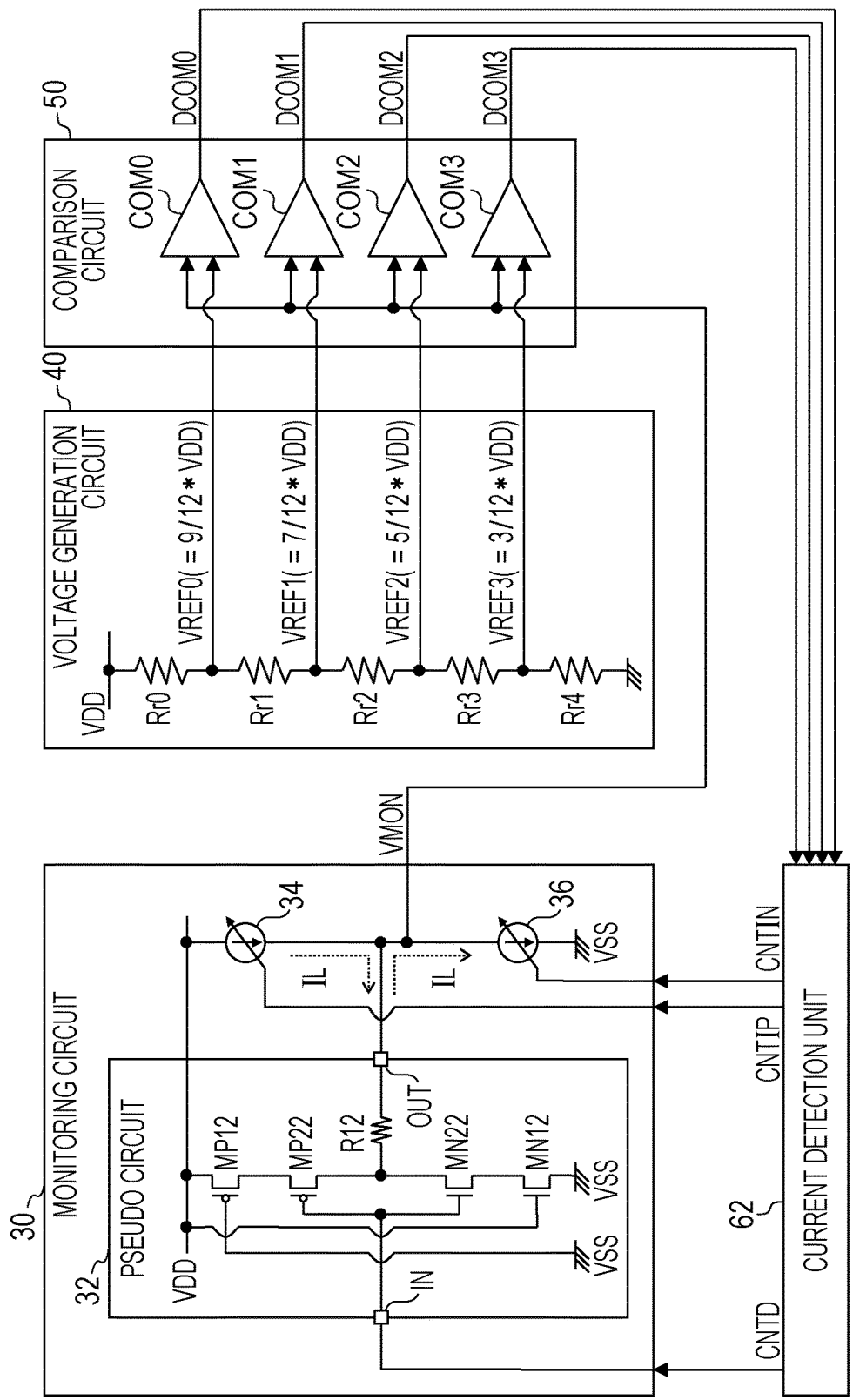
FIG. 4 is a diagram illustrating an example of a monitoring circuit, a voltage generation circuit, and a comparison circuit which are illustrated in FIG. 2.

FIG. 4 illustrates an example of the monitoring circuit 30, the voltage generation circuit 40 and the comparison circuit 50 which are illustrated in FIG. 2. FIG. 4 also illustrates the current detection unit 62 in the control circuit 60A illustrated in FIG. 2 such that flow of the control data CNTD, the control signals CNTIP and CNTIN, and the comparison result information DCOM can be easily understood.

A configuration of the monitoring circuit 30 is the same as that of the monitoring circuit 30 illustrated in FIG. 1. The current source 34 makes the load current IL with the amount which is obtained by multiplying a reference current (for example, current I0 illustrated in FIG. 6) with a preset amount by a value of the control signal CNTIP, flow into the output terminal OUT of the replica circuit 32. In addition, the current source 36 pulls out the load current IL with the amount which is obtained by multiplying the reference current (for example, current I0 illustrated in FIG. 6) with the preset amount by the value of the control signal CNTIN, from the output terminal OUT of the replica circuit 32.

The voltage generation circuit 40 includes resistors Rr0, Rr1, Rr2, Rr3, and Rr4 which are connected in series between the power supply line VDD and the ground line VSS. The voltage generation circuit 40 generates the reference voltages VREF0, VREF1, VREF2, and VREF3 which are divided by the resistors Rr0, Rr1, Rr2, Rr3, and Rr4. For example, a ratio between the resistors Rr0, Rr1, Rr2, Rr3, and Rr4 is represented by "Rr0:Rr1:Rr2:Rr3:Rr4=3:2:2:2:3". In this case, the reference voltage VREF0 which is output from a connection node between the resistor Rr0 and the resistor Rr1 is 9/12*VDD. The reference voltage VREF1 which is output from a connection node between the resistor Rr1 and the resistor Rr2 is 7/12*VDD. The reference voltage VREF2 which is output from a connection node between the resistor Rr2 and the resistor Rr3 is 5/12*VDD. The reference voltage VREF3 which is output from a connection node between the resistor Rr3 and the resistor Rr4 is 3/12*VDD.

The comparison circuit 50 includes four comparators COM (COM0, COM1, COM2, and COM3). The comparators COM0, COM1, COM2, and COM3 receive the monitoring voltage VMON from the monitoring circuit 30. In addition, the comparators COM0, COM1, COM2, and COM3 respectively receive the reference voltages VREF0, VREF1, VREF2, and VREF3 from the voltage generation circuit 40. In addition, the comparators COM (COM0, COM1, COM2, and COM3) respectively compare the monitoring voltage VMON with the reference voltages VREF, and outputs the comparison result information DCOM (DCOM0, DCOM1, DCOM2, and DCOM3) indicating the comparison results to the current detection unit 62.

For example, the comparator COM0 outputs the comparison result information DCOM0 of a logic value "1" to the current detection unit 62, in a case where the monitoring voltage VMON is higher than the reference voltage VREF0. That is, the comparator COM0 outputs the comparison result information DCOM0 of a logic value "0" to the current detection unit 62, in a case where the monitoring voltage VMON is equal to or lower than the reference voltage VREF0.

The comparator COM1 outputs the comparison result information DCOM1 of a logic value "1" to the current detection unit 62, in a case where the monitoring voltage VMON is higher than the reference voltage VREF1. In addition, the comparator COM1 outputs the comparison result information DCOM1 of a logic value "0" to the current detection unit 62, in a case where the monitoring voltage VMON is equal to or lower than the reference voltage VREF1.

The comparator COM2 outputs the comparison result information DCOM2 of a logic value "1" to the current detection unit 62, in a case where the monitoring voltage VMON is higher than the reference voltage VREF2. In addition, the comparator COM2 outputs the comparison result information DCOM2 of a logic value "0" to the current detection unit 62, in a case where the monitoring voltage VMON is equal to or lower than the reference voltage VREF2.

The comparator COM3 outputs the comparison result information DCOM3 of a logic value "1" to the current detection unit 62, in a case where the monitoring voltage VMON is higher than the reference voltage VREF3. In addition, the comparator COM3 outputs the comparison result information DCOM3 of a logic value "0" to the current detection unit 62, in a case where the monitoring voltage VMON is equal to or lower than the reference voltage VREF3. Configurations of the monitoring circuit 30, the voltage generation circuit 40, and the comparison circuit 50 are not limited to the example illustrated in FIG. 4.

Figure 5:
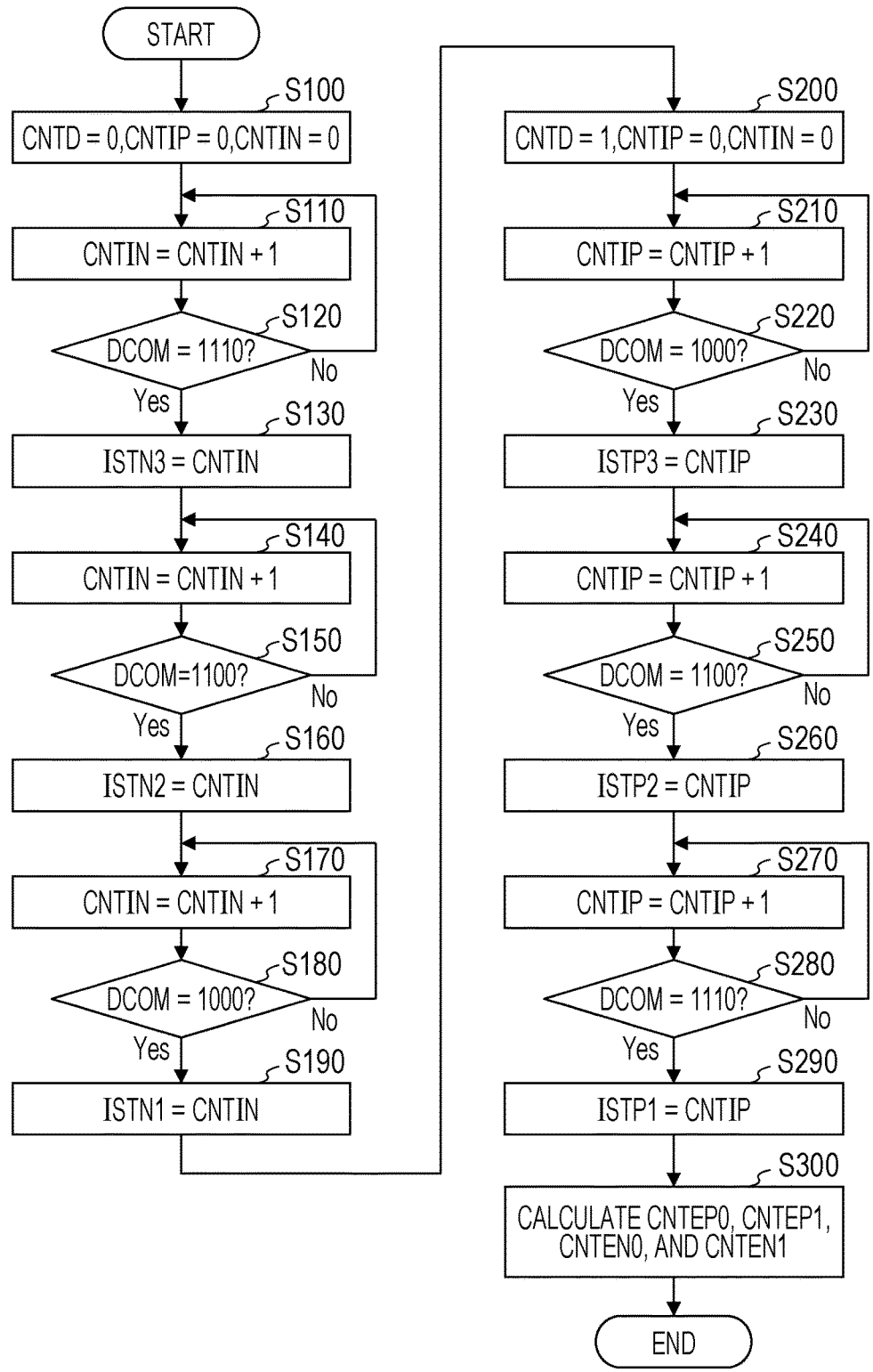
FIG. 5 is a diagram illustrating an example of an operation of the termination resistance adjustment circuit illustrated in FIG. 2.

FIG. 5 illustrates an example of an operation of the termination resistance adjustment circuit 20A illustrated in FIG. 2. The operation illustrated in FIG. 5 may be performed only by hardware, and may be performed by controlling hardware using software. FIG. 5 mainly illustrates an operation of the control circuit 60A (particularly, the current detection unit 62).

In step S100, the current detection unit 62 sets the control data CNTD to "0" (logic low level), and sets the values of the control signals CNTIP and CNTIN to "0". Thereby, the monitoring voltage VMON becomes the same voltage (or approximately the same voltage) as a power supply voltage VDD. Hence, as processing of step S100 is performed, the comparison result information DCOM becomes "1111". In FIG. 5, a zeroth bit (least significant bit) of the comparison result information DCOM indicates the comparison result information DCOM0, a first bit of the comparison result information DCOM indicates the comparison result information DCOM1, and a second bit of the comparison result information DCOM indicates the comparison result information DCOM2. In addition, a third bit (most significant bit) of the comparison result information DCOM indicates the comparison result information DCOM3. After the processing of step S100, processing of step S110 is performed.

In step S110, the current detection unit 62 increases (CNTIN=CNOIN+1) the value of the control signal CNTIN. Thereby, the load current IL with the amount which is obtained by multiplying the reference current (for example, current I0 illustrated in FIG. 6) with a preset amount by the value of the control signal CNTIN flows out of the output terminal OUT of the replica circuit 32. The monitoring voltage VMON decreases as the load current IL flowing out of the output terminal OUT increases. After the processing of step S110 is performed, processing of step S120 is performed.

In step S120, the current detection unit 62 determines whether or not the comparison result information DCOM is "1110". For example, in a case where the monitoring voltage VMON is changed from a voltage higher than the reference voltage VREF0 to a voltage equal to or lower than the reference voltage VREF0, the comparison result information DCOM is changed from "1111" to "1110".

In a case where the comparison result information DCOM is "1110", the operation of the current detection unit 62 proceeds to step S130. In processing (for example, processing or step S300, or the like) after step S130, a level (voltage value) of the monitoring voltage VMON when the comparison result information DCOM is changed from "1111" to "1110" is processed in the same manner as the reference voltage VREF0.

Meanwhile, in a case where the comparison result information DCOM is not "1110" (that is, a case where the comparison result information DCOM is "1111"), the operation of the current detection unit 62 returns to step S110. That is, the processing of step S130 is performed in a case where the monitoring voltage VMON is changed from a voltage higher than the reference voltage VREF0 to a voltage equal to or lower than the reference voltage VREF0.

In step S130, the current detection unit 62 sets the current information ISTN3 to the value of the control signal CNTIN. That is, the current information ISTN3 is set to the value of the control signal CNTIN when the comparison result information DCOM is changed from "1111" to "1110". After the processing of step S130 is performed, processing of step S140 is performed.

In step S140, the current detection unit 62 increases (CNTIN=CNTIN+1) the value of the control signal CNTIN. After the processing of step S140 is performed, processing of step S150 is performed.

In step S150, the current detection unit 62 determines whether or not the comparison result information DCOM is "1100". For example, in a case where the monitoring voltage VMON is changed from a voltage higher than the reference voltage VREF1 to a voltage equal to or lower than the reference voltage VREF1, the comparison result information DCOM is changed from "1110" to "1100".

In a case where the comparison result information DCOM is "1100", the operation of the current detection unit 62 proceeds to step S160. In processing (for example, processing or step S300, or the like) after step S160, a level (voltage value) of the monitoring voltage VMON when the comparison result information DCOM is changed from "1110" to "1100" is processed in the same manner as the reference voltage VREF1.

Meanwhile, in a case where the comparison result information DCOM is not "1100" (that is, a case where the comparison result information DCOM is "1110"), the operation of the current detection unit 62 returns to step S140.

In step S160, the current detection unit 62 sets the current information ISTN2 to the value of the control signal CNTIN. That is, the current information ISTN2 is set to the value of the control signal CNTIN when the comparison result information DCOM is changed from "1110" to "1100". After the processing of step S160 is performed, processing of step S170 is performed.

In step S170, the current detection unit 62 increases (CNTIN=CNTIN+1) the value of the control signal CNTIN. After the processing of step S170 is performed, processing of step S180 is performed.

In step S180, the current detection unit 62 determines whether or not the comparison result information DCOM is "1000". For example, in a case where the monitoring voltage VMON is changed from a voltage higher than the reference voltage VREF2 to a voltage equal to or lower than the reference voltage VREF2, the comparison result information DCOM is changed from "1100" to "1000".

In a case where the comparison result information DCOM is "1000", the operation of the current detection unit 62 proceeds to step S190. In processing (for example, processing or step S300, or the like) after step S190, a level (voltage value) of the monitoring voltage VMON when the comparison result information DCOM is changed from "1100" to "1000" is processed in the same manner as the reference voltage VREF2.

Meanwhile, in a case where the comparison result information DCOM is not "1000" (that is, a case where the comparison result information DCOM is "1100"), the operation of the current detection unit 62 returns to step S170.

In step S190, the current detection unit 62 sets the current information ISTN1 to the value of the control signal CNTIN. That is, the current information ISTN1 is set to the value of the control signal CNTIN when the comparison result information DCOM is changed from "1100" to "1000". After the processing of step S190 is performed, processing of step S200 is performed.

In step S200, the current detection unit 62 sets the control data CNTD to "1" (logic high level), and sets the values of the control signals CNTIP and CNTIN to "0". Thereby, the monitoring voltage VMON becomes a voltage (or approximately the same voltage) which is the same as a ground voltage VSS. Hence, the comparison result information DCOM becomes "0000" as the processing of step S200 is performed. After the processing of step S200 is performed, processing of step S210 is performed.

In step S210, the current detection unit 62 increases (CNTIP=CNTIP+1) the value of the control signal CNTIP. Thereby, the load current IL with the amount which is obtained by multiplying the reference current (for example, current I0 illustrated in FIG. 6) with a preset amount by the value of the control signal CNTIP flows into the output terminal OUT of the replica circuit 32. The monitoring voltage VMON increases as the load current IL flowing into the output terminal OUT increases. After the processing of step S210 is performed, processing of step S220 is performed.

In step S220, the current detection unit 62 determines whether or not the comparison result information DCOM is "1000". For example, in a case where the monitoring voltage VMON is changed from a voltage equal to or lower than the reference voltage VREF3 to a voltage higher than the reference voltage VREF3, the comparison result information DCOM is changed from "0000" to "1000".

In a case where the comparison result information DCOM is "1000", the operation of the current detection unit 62 proceeds to step S230. In processing (for example, processing or step S300, or the like) after step S230, a level (voltage value) of the monitoring voltage VMON when the comparison result information DCOM is changed from "0000" to "1000" is processed in the same manner as the reference voltage VREF3.

Meanwhile, in a case where the comparison result information DCOM is not "1000" (that is, a case where the comparison result information DCOM is "0000"), the operation of the current detection unit 62 returns to step S210. That is, the processing of step S230 is performed in a case where the monitoring voltage VMON is changed from a voltage equal to or lower than the reference voltage VREF3 to a voltage higher than the reference voltage VREF3.

In step S230, the current detection unit 62 sets the current information ISTP3 to the value of the control signal CNTIP. That is, the current information ISTP3 is set to the value of the control signal CNTIP when the comparison result information DCOM is changed from "0000" to "1000". After the processing of step S230 is performed, processing of step S240 is performed.

In step S240, the current detection unit 62 increases (CNTIP=CNTIP+1) the value of the control signal CNTIP. After the processing of step S240 is performed, processing of step S250 is performed.

In step S250, the current detection unit 62 determines whether or not the comparison result information DCOM is "1100". For example, in a case where the monitoring voltage VMON is changed from a voltage equal to or lower than the reference voltage VREF2 to a voltage higher than the reference voltage VREF2, the comparison result information DCOM is changed from "1000" to "1100".

In a case where the comparison result information DCOM is "1100", the operation of the current detection unit 62 proceeds to step S260. In processing (for example, processing or step S300, or the like) after step S260, a level (voltage value) of the monitoring voltage VMON when the comparison result information DCOM is changed from "1000" to "1100" is processed in the same manner as the reference voltage VREF2.

Meanwhile, in a case where the comparison result information DCOM is not "1100" (that is, a case where the comparison result information DCOM is "1000"), the operation of the current detection unit 62 returns to step S240.

In step S260, the current detection unit 62 sets the current information ISTP2 to the value of the control signal CNTIP. That is, the current information ISTP2 is set to the value of the control signal CNTIP when the comparison result information DCOM is changed from "1000" to "1100". After the processing of step S260 is performed, processing of step S270 is performed.

In step S270, the current detection unit 62 increases (CNTIP=CNTIP+1) the value of the control signal CNTIP. After the processing of step S270 is performed, processing of step S280 is performed.

In step S280, the current detection unit 62 determines whether or not the comparison result information DCOM is "1110". For example, in a case where the monitoring voltage VMON is changed from a voltage equal to or lower than the reference voltage VREF1 to a voltage higher than the reference voltage VREF1, the comparison result information DCOM is changed from "1100" to "1110".

In a case where the comparison result information DCOM is "1110", the operation of the current detection unit 62 proceeds to step S290. In processing (for example, processing or step S300, or the like) after step S290, a level (voltage value) of the monitoring voltage VMON when the comparison result information DCOM is changed from "1100" to "1110" is processed in the same manner as the reference voltage VREF1.

Meanwhile, in a case where the comparison result information DCOM is not "1110" (that is, a case where the comparison result information DCOM is "1100"), the operation of the current detection unit 62 returns to step S270.

In step S290, the current detection unit 62 sets the current information ISTP1 to the value of the control signal CNTIP. That is, the current information ISTP1 is set to the value of the control signal CNTIP when the comparison result information DCOM is changed from "1100" to "1110". After the processing of step S290 is performed, processing of step S300 is performed.

In step S300, the control circuit 60A calculates the control signals CNTEP0, CNTEP1, CNTEN0, and CNTEN1, using the current information ISTP1-ISTP3, ISTN1-ISTN3, and the like. A method of calculating the control signals CNTEP0, CNTEP1, CNTEN0, and CNTEN1 will be described with reference to FIG. 6. The operation of the termination resistance adjustment circuit 20A is not limited to the example illustrated in FIG. 5.

FIG. 6 illustrates an example of equations which are used when the number of use of the drive circuits 80 and 81 is calculated. In FIG. 6 or later, there is also a case where description is made by attaching the same symbols or reference numerals as resistance information RM (RMP1, RMP2, RMP3, RMN1, RMN2, and RMN3) to the output resistances of the replica circuit 32.

The output resistances RM (RMP1, RMP2, RMP3, RMN1, RMN2, and RMN3) of the replica circuit 32 at each output level of the monitoring voltage VMON are respectively represented by Equation (1) to Equation (6) as described in FIG. 6.

$$RMP1 = (7/12 * VDD)/(I0 * ISTN1) \quad (1)$$

$$RMP2 = (5/12 * VDD)/(I0 * ISTN2) \quad (2)$$

$$RMP3 = (3/12 * VDD)/(I0 * ISTN3) \quad (3)$$

$$RMN1 = (7/12 * VDD)/(I0 * ISTP1) \quad (4)$$

$$RMN2 = (5/12 * VDD)/(I0 * ISTP2) \quad (5)$$

$$RMN3 = (3/12 * VDD)/(I0 * ISTP3) \quad (6)$$

The current I0 indicates a current per step of the control signals CNTIP and CNTIN. For example, the current I0 is a reference current with a preset amount. In addition, the current information ISTP1 to ISTP3 and ISTN1 to ISTN3 is determined by the operation illustrated in FIG. 5.

The output resistance RMP1 indicates resistance between the power supply line VDD and the output terminal OUT when the monitoring voltage VMON is equal (or approximately equal) to the reference voltage VREF2 (=5/12*VDD). That is, the output resistance RMP1 corresponds to the termination resistance of one drive circuit 80 in a case where input data D1 and D0 among the input patterns (11, 10, 01, and 00) of the input data D with two bits is "10".

The output resistance RMP2 indicates resistance between the power supply line VDD and the output terminal OUT when the monitoring voltage VMON is equal (or approximately equal) to the reference voltage VREF1 (=7/12*VDD). That is, the output resistance RMP2 corresponds to the termination resistance of one drive circuit 81 in a case where input data D1 and D0 is "01".

The output resistance RMP3 indicates resistance between the power supply line VDD and the output terminal OUT when the monitoring voltage VMON is equal (or approximately equal) to the reference voltage VREF0 (=9/12*VDD). That is, the output resistance RMP3 corresponds to the termination resistance of one drive circuit 80 and the termination resistance of one drive circuit 81 in a case where input data D1 and D0 is "00".

The output resistance RMN1 indicates the resistance between the ground line VSS and the output terminal OUT when the monitoring voltage VMON is equal (or approximately equal) to the reference voltage VREF1 (=7/12*VDD). That is, the output resistance RMN1 corresponds to the termination resistance of one drive circuit 80 in a case where input data D1 and D0 is "01".

The output resistance RMN2 indicates the resistance between the ground line VSS and the output terminal OUT when the monitoring voltage VMON is equal (or approximately equal) to the reference voltage VREF2 (=5/12*VDD). That is, the output resistance RMN2 corresponds to the termination resistance of one drive circuit 81 in a case where input data D1 and D0 is "10".

The output resistance RMN3 indicates the resistance between the ground line VSS and the output terminal OUT when the monitoring voltage VMON is equal (or approximately equal) to the reference voltage VREF3 (=3/12*VDD). That is, the output resistance RMN3 corresponds to the termination resistance of one drive circuit 80 and the termination resistance of one drive circuit 81 in a case where input data D1 and D0 is "11".

For example, the resistance calculation unit 64 calculates the respective output resistances RMP1, RMP2, RMP3, RMN1, RMN2, and RMN3 by inserting the current information ISTP1 to ISTP3 and ISTN1 to ISTN3 received from the current detection unit 62 into Equation (1) to Equation (6).

Relationships between the number of use PTE0 and NTE0 of the drive circuits 80, the number of use PTE1 and NTE1 of the drive circuits 81, and the output resistances RM are represented by Equation (7) to Equation (14), in a case where a specified value of the termination resistance of the transmission circuit 70 is 50 CI. Each number of use which is set by the control signals CNTEP0, CNTEP1, CNTEN0, and CNTEN1 corresponds to each number of use PTE0, PTE1, NTE0, and NTE1. The number of use PTE0, PTE1, NTE0, and NTE1 which satisfy the relationships of Equation (7) to Equation (14) is not limited to an integer, and thus, there is also a case where the number of use is different from the number of use which is actually set.

$$(RMP3/PTE0 + RMP1/PTE0)/2 = 150 \quad (7)$$

$$PTE0 = (RMP3 + RMP1)/300 \quad (8)$$

$$(RMP3/PTE1 + RMP2/PTE1)/2 = 75 \quad (9)$$

$$PTE1 = (RMP3 + RMP2)/150 \quad (10)$$

$$(RMN3/NTE0 + RMN1/NTE0)/2 = 150 \quad (11)$$

$$NTE0 = (RMN3 + RMN1)/300 \quad (12)$$

$$(RMN3/NTE1 + RMN2/NTE1)/2 = 75 \quad (13)$$

$$NTE1 = (RMN3 + RMN2)/150 \quad (14)$$

The number of use PTE0 indicates the number of the drive circuits 80 in which the transistor MP10 is turned on. For example, Equation (7) represents that an average value of the combined value of the termination resistances of "PTE0" drive circuits 80 when the input data D1 an D0 is "00", and the combined value of the termination resistances of "PTE0" drive circuits 80 when the input data D1 and D0 is "10" is 150Ω. The number PTE0 of the drive circuits 80 in which the transistor MP10 is turned on is represented by Equation (8) which are modified from Equation (7).

The number of use PTE1 indicates the number of the drive circuits 81 in which the transistor MP10 is turned on. For example, Equation (9) represents that an average value of the combined value of the termination resistances of "PTE1" drive circuits 81 when the input data D1 an D0 is "00", and the combined value of the termination resistances of "PTE1" drive circuits 81 when the input data D1 and D0 is "01" is 75Ω. The number PTE1 of the drive circuits 81 in which the transistor MP10 is turned on is represented by Equation (10) which are modified from Equation (9).

The number of use NTE0 indicates the number of the drive circuits 80 in which the transistor MN10 is turned on. For example, Equation (11) represents that an average value of the combined value of the termination resistances of "NTE0" drive circuits 80 when the input data D1 an D0 is "11", and the combined value of the termination resistances of "NTE0" drive circuits 80 when the input data D1 and D0 is "01" is 150Ω. The number NTE0 of the drive circuits 80 in which the transistor MN10 is turned on is represented by Equation (12) which are modified from Equation (11).

The number of use NTE1 indicates the number of the drive circuits 81 in which the transistor MN10 is turned on. For example, Equation (13) represents that an average value of the combined value of the termination resistances of "NTE1" drive circuits 81 when the input data D1 an D0 is "11", and the combined value of the termination resistances of "NTE1" drive circuits 81 when the input data D1 and D0 is "10" is 75 SI. The number NTE1 of the drive circuits 81 in which the transistor MN10 is turned on is represented by Equation (14) which are modified from Equation (13).

For example, the code calculation unit 66 calculates each number of use PTE0, PTE1, NTE0, and NTE1 by inserting the output resistances RMP1 to RMP3 and RMN1 to RMN3 received from the resistance calculation unit 64 into Equation (8), Equation (10), Equation (12), and Equation (14). In addition, the code calculation unit 66 determines an integer closest to the number of use PTE0 as the number of the drive circuits 80 which turns on the transistor MP10, and generates the control signal CNTEP0 by converting the determined number of use into a thermometer code. For example, the thermometer code is a code indicating that each code corresponding to each of the plurality of drive circuits 80 (a plurality of drive circuits 81, in the control signals CNTEP1 AND CNTEN1) denotes use or disuse of the drive circuit 80.

For example, in a case where the transmission circuit 70n includes q (q is an integer equal to or greater than 2) drive circuits 80, bits of the same number as the determined number of use (integer closest to the number of use PTE0) among q bits included in the control signal CNTEP0 are set to "0". The control signals CNTEP1, CNTEN0, and CNTEN1 are also generated based on the number of use PTE1, NTE0, and NTE1 in the same method as the control signal CNTEP0.

As such, the control circuit 60A adjusts the number of use of the drive circuits 81 and 80 for each bit of the input data D (D1 and D0) with two bits, based on the values of the output resistances RM of the replica circuit 32 which are calculated for each of the plurality of levels of the monitoring voltage VMON, thereby adjusting the value of the termination resistance of the transmission circuit 72. That is, the termination resistance adjustment circuit 20A separately adjusts the number of use of the drive circuits 81 and 80, using the values of the output resistances RM of the replica circuit 32 which are calculated for each of the plurality of input patterns of the input data D with two bits. Thereby, it is possible to suppress variation (variation depending on a change of the input pattern) of the ratio between the combined value of the termination resistances of the drive circuits 81 and the combined values of the termination resistances of the drive circuits 80, compared to a case where the number of use of the drive circuits 80 and 81 is adjusted based on one input pattern.

Furthermore in the example of FIG. 6, the control circuit 60A separately adjusts each value of a first termination resistance connected to the power supply line VDD and a second termination resistance connected to the ground line VSS, among the termination resistances of the transmission circuit 72. Thereby, the number of use of the drive circuits 81 and 80 can approach the number of use which satisfies Equation (7), Equation (9), Equation (11), and Equation (13), compared to a case where the first termination resistance and the second termination resistance are not adjusted. That is, it is possible to appropriately adjust the value of the termination resistance of the transmission circuit 72.

Figure 7:
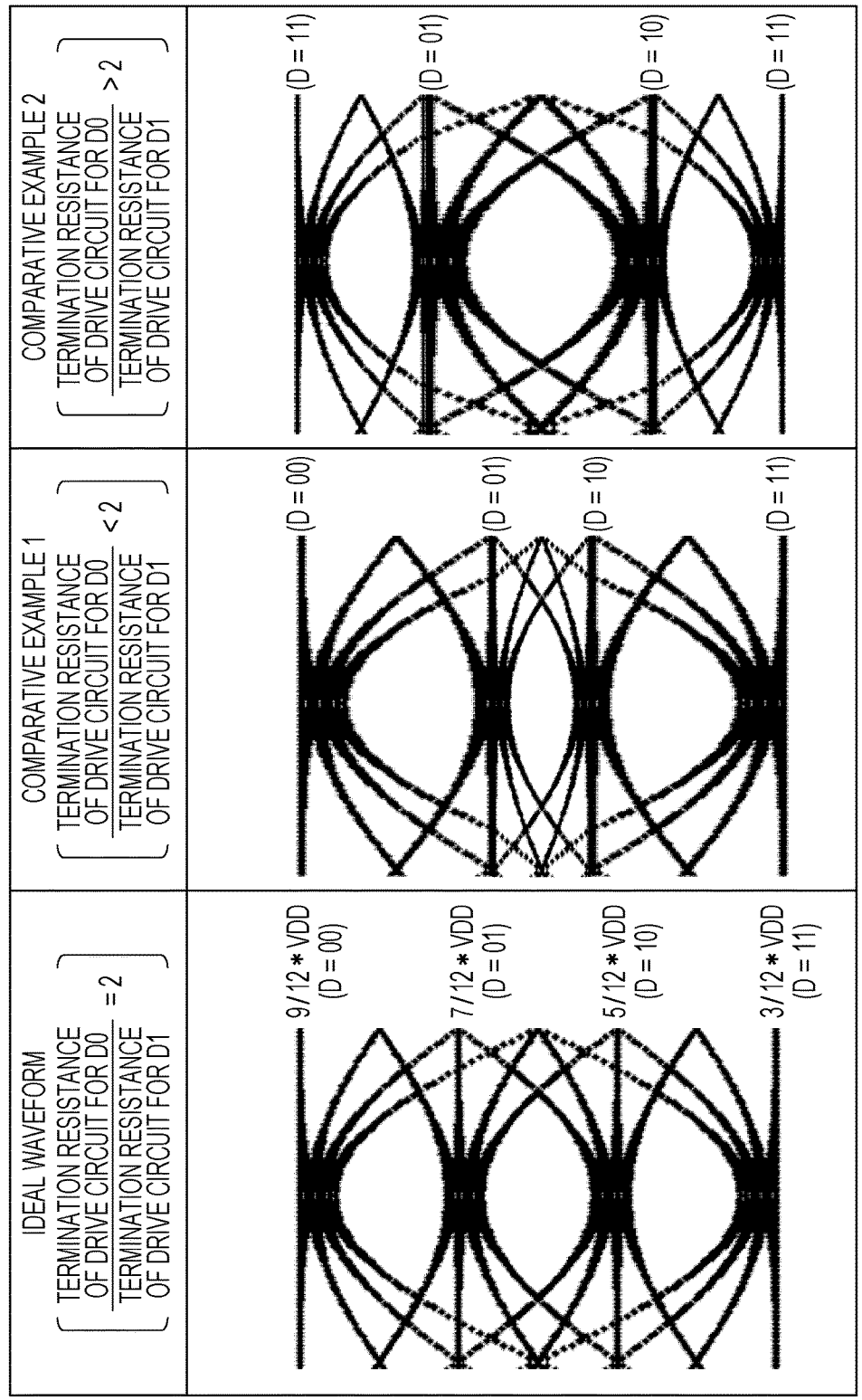
FIG. 7 is a diagram illustrating an example of signal waveforms which are generated by 4PAM.

FIG. 7 illustrates an example of signal waveforms generated by 4PAM. An ideal waveform indicates a signal waveform of 4PAM in a case where the value of the combined resistance of the drive circuit 80 is double of the value of the combined resistance of the drive circuit 81 regardless of the value of the input data D1 and D0, thereby being stabilized. In the ideal waveform, differences between the respective voltage levels of the output signals DOUT become equal to each other. For example, a difference between four voltage levels (9/12*VDD, 7/12*VDD, 5/12*VDD, and 3/12*VDD) respectively corresponding to four values which are represented by the input data D1 and D0 with two bits is 1/6*VDD.

Comparative example 1 illustrates signal waveforms of 4PAM in a case where the value of the combined resistance of the drive circuit 80 is smaller than double of the value of the combined resistance of the drive circuit 81, and Comparative example 2 illustrates a signal waveform of 4PAM in a case where the value of the combined resistance of the drive circuit 80 is larger than double of the value of the combined resistance of the drive circuit 81. In Comparative example 1 and Comparative example 2, a difference between the respective voltage levels of the output signals DOUT varies.

The termination resistance adjustment circuit 20A illustrated in FIG. 2 adjusts the number of use of the drive circuits 80 and 81 such that the value of the combined resistance of the drive circuit 80 is approximately double of the value of the combined resistance of the drive circuit 81 regardless of the value of the input data D1 and D0, thereby being stabilized. That is, the termination resistance adjustment circuit 20A adjusts the number of use of the drive circuits 80 and 81 such that the signal waveforms of the output signals DOUT which are output from the transmission circuits 70n and 70p approach the ideal waveform illustrated in FIG. 7.

As described above, it is possible to obtain the same effects as in the embodiment illustrated in FIG. 1, also in the embodiments illustrated in FIG. 2 to FIG. 7. For example, the termination resistance adjustment circuit 20A separately adjusts the number of use of the drive circuits 80 and 81, based on the output resistances RMP1, RMP2, RMP3, RMN1, RMN2, and RMN3 which are calculated for each of a plurality of levels of the monitoring voltage VMON. Thereby, it is possible to suppress variation (variation depending on a change of the input pattern) of a ratio between the value of the combined resistance of the drive circuit 81 and the value of combined resistance of the drive circuit 80, compared to a case where the number of use of the drive circuits 80 and 81 is adjusted based on one input pattern. Accordingly, the termination resistance adjustment circuit 20A appropriately adjusts the value of the termination resistance of the transmission circuit 72.

Furthermore, the termination resistance adjustment circuit 20A separately sets the number of the drive circuits 80 which turn on the transistor MP10, and the number of the drive circuits 80 which turn on the transistor MN10. In addition, the termination resistance adjustment circuit 20A separately sets the number of the drive circuits 81 which turn on the transistor MP10, and the number of the drive circuits 81 which turn on the transistor MN10. Thereby, the termination resistance adjustment circuit 20A can separately adjust the values of each of the first termination resistance which is connected to the power supply line VDD and the second termination resistance which is connected to the ground line VSS, among the termination resistances of the transmission circuit 72. Accordingly, it is possible to appropriately adjust the values of termination resistances of the transmission circuit 72 in accordance with the characteristics of the MOS transistors.

Figure 8:
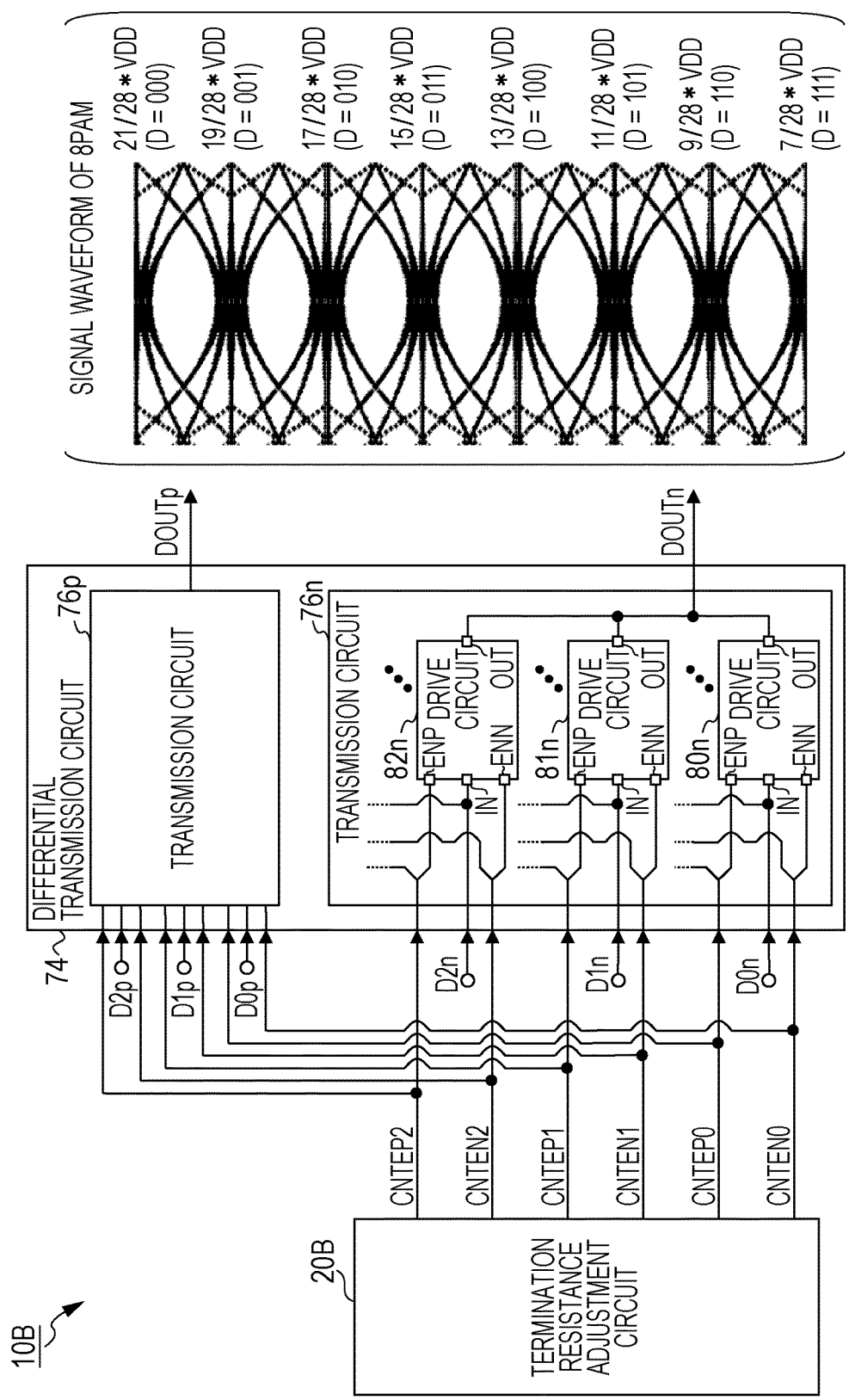
FIG. 8 is a diagram illustrating a termination resistance adjustment circuit and a device including the termination resistance adjustment circuit according to still another embodiment.

FIG. 8 illustrates still another embodiment of the termination resistance adjustment circuit and the device including the termination resistance adjustment circuit. The same or similar symbols or reference numerals will be attached to the elements which are the same as or similar to the elements illustrated in FIG. 1 to FIG. 7, and detailed description thereof will be omitted. A device 10B illustrated in FIG. 8 includes a differential transmission circuit 74, and a termination resistance adjustment circuit 20B which adjusts a value of a termination resistance of the differential transmission circuit 74. The differential transmission circuit 74 and the termination resistance adjustment circuit 20B are mounted in, for example, a basic device or the like of an information processing device or a communication system of a server or the like.

The differential transmission circuit 74 receives differential input data D, and outputs differential output signals DOUT (DOUTp and DOUTn) to a receiving device or the like (not illustrated). The input data D0$p$ is an inverted signal of the input data D0$n$, the input data D1$p$ is an inverted signal of the input data D1$n$, and the input data D2$p$ is an inverted signal of the input data D2$n$.

For example, the differential transmission circuit 74 includes transmission circuits 76$n$ and 76$p$. A configurations of the transmission circuit 76$n$ is the same as or similar to the configuration of the transmission circuit 70$n$, except that a drive circuit 82$n$ for the input data D2 is added to the transmission circuit 70$n$ illustrated in FIG. 2. In addition, the transmission circuit 76$p$ is the same as or similar to the transmission circuit 76$n$, except that the transmission circuit 76$p$ receives input data D0$p$, D1$p$, and D2$p$ instead of the input data D0$n$, D1$n$, and D2$n$ and outputs an output signal DOUTp instead of the output signal DOUTn.

The transmission circuit 76$n$ performs 8-level pulse amplitude modulation (8PAM), and generates the output signals DOUTn including any one of eight voltage levels corresponding to eight values which are represented by the input data D2$n$, D1$n$, and D0$n$ with three bits. Signal waveforms of 8PAM in a parenthesis illustrated in FIG. 8 illustrate an example of waveforms of the signals which are generated by 8PAM. For example, a voltage level of the output signal DOUTn corresponding to the input data D (D2$n$, D1$n$, and D0$n$) of "000" is 21/28*VDD. A voltage level of the output signal DOUTn corresponding to the input data D of "001" is 19/28*VDD, and a voltage level of the output signal DOUTn corresponding to the input data D of "010" is 17/28*VDD. A voltage level of the output signal DOUTn corresponding to the input data D of "011" is 15/28*VDD, and a voltage level of the output signal DOUTn corresponding to the input data D of "100" is 13/28*VDD. A voltage level of the output signal DOUTn corresponding to the input data D of "101" is 11/28*VDD, and a voltage level of the output signal DOUTn corresponding to the input data D of "110" is 9/28*VDD. A voltage level of the output signal DOUTn corresponding to the input data D of "111" is 7/28*VDD.

For example, the transmission circuit 76$n$ includes a plurality of drive circuits 80$n$ which receive the input data D0$n$, a plurality of drive circuits 81$n$ which receive the input data D1$n$, and a plurality of drive circuits 82$n$ which receive the input data D2$n$. Configurations of the drive circuits 80$n$ and 81$n$ are the same as or similar to the drive circuits 80$n$ and 81$n$ illustrated in FIG. 2. In addition, the drive circuit 82$n$ is the same as or similar to the drive circuit 80$n$, except for the drive circuit 82$n$ receives the input data D2$n$ and control signals CNTEP2 and CNTEN2 instead of the input data D0$n$ and the control signals CNTEP0 and CNTEN0. Output terminals OUT of the drive circuits 80$n$, 81$n$, and 82$n$ are connected to each other.

Hence, values of termination resistances of the transmission circuit 76$n$ are adjusted by adjusting the number of use of the drive circuits 82$n$, 81$n$, and 80$n$ for each bit of the input data D (D2$n$, D1$n$, and D0$n$) with three bits. Hereinafter, the drive circuit 80$n$ is also referred to as the drive circuit 80, the drive circuit 81$n$ is also referred to as the drive circuit 81, and the drive circuit 82$n$ is also referred to as the drive circuit 82.

The termination resistance adjustment circuit 20B adjusts the number of use of each of the drive circuits 82, 81, and 80, using control signals CNTE (CNTEN0 to CNTEN2 and CNTEP0 to CNTEP2). Thereby, the values of the termination resistances of the transmission circuits 76$n$ and 76$p$ are adjusted. Details of the termination resistance adjustment circuit 20B are illustrated in FIG. 9.

Configurations (that is, a configuration of the device 10B) of the termination resistance adjustment circuit 20B and the differential transmission circuit 74 are not limited to the example illustrated in FIG. 8. For example, each transmission circuit 76 (76$n$ and 76$p$) may generate the output signal DOUT by performing an amplitude modulation of the input data D with four bits or more. In this case, the transmission circuit 76 includes a plurality of drive circuits which are the same as or similar to the drive circuit 80$n$ for each bit of the input data D. In addition, the termination resistance adjustment circuit 20B adjusts the values of termination resistances of the respective transmission circuits 76 by adjusting the number of use of the drive circuits for each bit of the input data D. In addition, the device 10B may include a transmission circuit (circuit in which one of the transmission circuits 76$n$ and 76$p$ is omitted from the differential transmission circuit 74) of a single-ended input instead of the differential transmission circuit 74.

Figure 9:
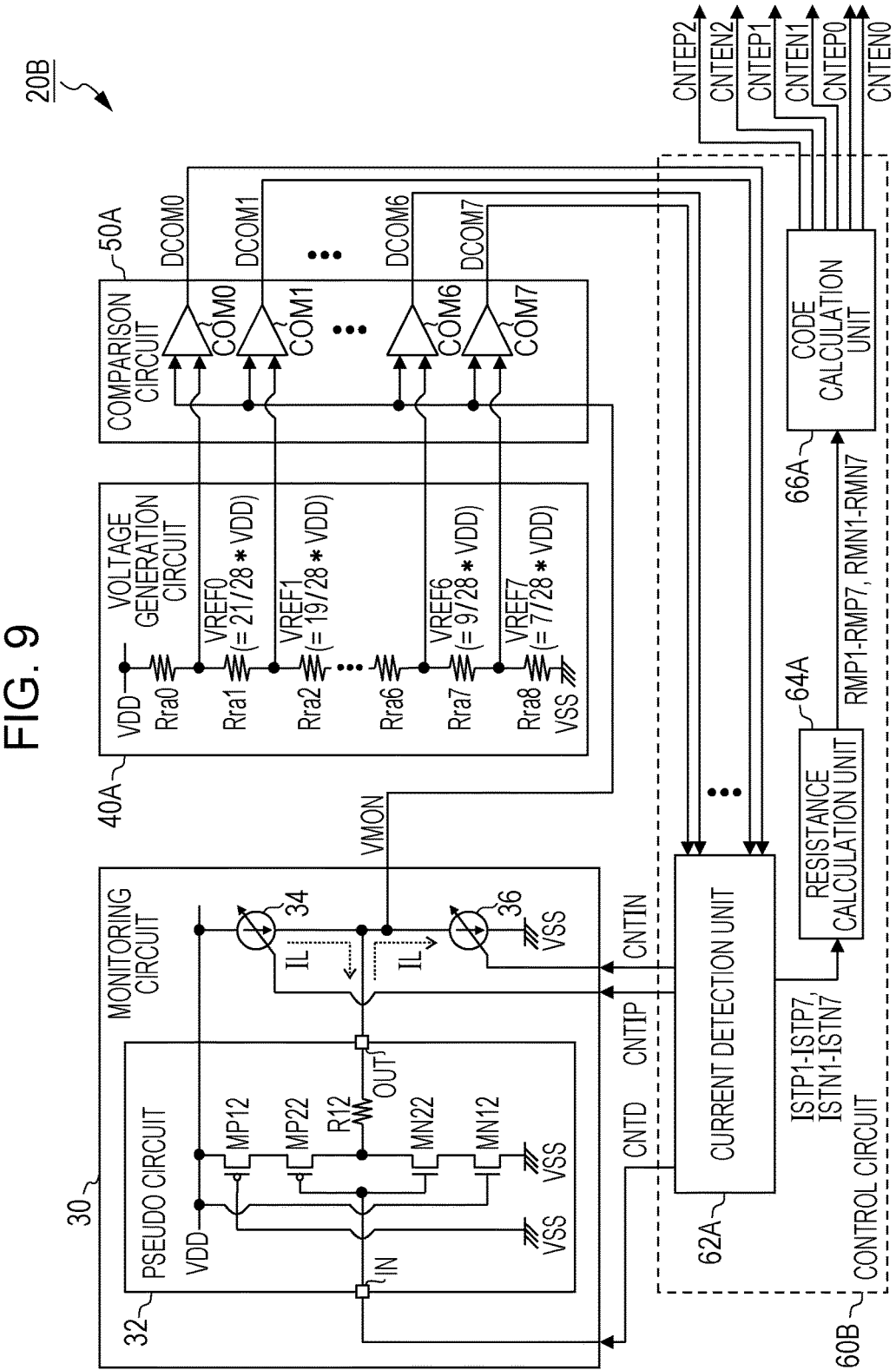
FIG. 9 is a diagram illustrating an example of the termination resistance adjustment circuit illustrated in FIG. 8.

FIG. 9 illustrates an example of the termination resistance adjustment circuit 20B illustrated in FIG. 8. The termination resistance adjustment circuit 20B includes, for example, a monitoring circuit 30, a voltage generation circuit 40A, a comparison circuit 50A, and a control circuit 60B.

The monitoring circuit 30 is the same as or similar to the monitoring circuit 30 illustrated in FIG. 4. For example, the monitoring circuit 30 includes the replica circuit 32 which includes an output resistance with the same characteristics as the termination resistance of the drive circuit 80 and the current sources 34 and 36. the current source 34 makes the load current IL with the amount which is obtained by multiplying a reference current (for example, current I0 illustrated in FIG. 6) with a preset amount by a value of the control signal CNTIP, flow into the output terminal OUT of the replica circuit 32. In addition, the current source 36 pulls out the load current IL with the amount which is obtained by multiplying the reference current (for example, current I0 illustrated in FIG. 6) with the preset amount by the value of the control signal CNTIN, from the output terminal OUT of the replica circuit 32.

The voltage generation circuit 40A generates eight reference voltages VREF (VREF0, VREF1, . . . , VREF6, and VREF7) respectively corresponding to eight values which are represented by input data D2, D1, and D0 with three bits that are supplied to the transmission circuit 76. The voltage generation circuit 40A are similar to the voltage generation circuit 40 illustrated in FIG. 4 except for the number of reference voltages VREF (VREF1 to VREF7) which are generated.

For example, the voltage generation circuit 40A includes nine resistors Rra (Rra0, Rra1, Rra2, . . . , Rra6, Rra7, and Rra8) connected in series between the power supply line VDD and the ground line VSS. In addition, the voltage generation circuit 40A generates eight reference voltages VREF (VREF0, VREF1, . . . , VREF6, and VREF7) which are divided by the nine resistors Rra. For example, a ratio between the resistor Rra0 and the resistor Rra1 is represented by "Rra0:Rra1=7:2". In addition, for example, the resistor Rra8 has the same resistance value (or approximately the same) as the resistor Rra0, and the seven resistors Rra except for the resistors Rra0 and Rra8, among the nine resistors Rra have the same resistance value (or approximately the same) as each other.

In this case, the reference voltage VREF0 which is output from a connection node between the resistor Rra0 and the resistor Rra1 is 21/28*VDD. The reference voltage VREF1 which is output from a connection node between the resistor Rra1 and the resistor Rra2 is 19/28*VDD. In addition, the reference voltage VREF6 which is output from a connection node between the resistor Rra6 and the resistor Rra7 is 9/28*VDD. The reference voltage VREF8 which is output from a connection node between the resistor Rra7 and the resistor Rra8 is 7/28*VDD.

The comparison circuit 50A is the same as or similar to the comparison circuit 50 illustrated in FIG. 4, except for the number of the comparators COM. For example, the comparison circuit 50A includes eight comparators COM (COM0, COM1, ..., COM6, and COM7), and outputs eight comparison result information DCOM (DCOM0, DCOM1, ..., DCOM6, and DCOM7) to a current detection unit 62A of the control circuit 60B.

For example, the comparators COM0 to COM7 receive the monitoring voltage VMON from the monitoring circuit 30. In addition, the comparators COM0 to COM7 respectively receive the reference voltages VREF0 to VREF7 from the voltage generation circuit 40. In addition, each comparator COM (COM0 to COM7) compares the monitoring voltage VMON with each reference voltage VREF, and outputs each comparison result information DCOM (DCOM0, DCOM1, ..., DCOM6, and DCOM7) indicating the comparison results to a current detection unit 62A.

For example, the comparator COM0 outputs the comparison result information DCOM0 of a logic value "1" to the current detection unit 62A, in a case where the monitoring voltage VMON is higher than the reference voltage VREF0. That is, the comparator COM0 outputs the comparison result information DCOM0 of a logic value "0" to the current detection unit 62A, in a case where the monitoring voltage VMON is equal to or lower than the reference voltage VREF0.

The comparator COM1 outputs the comparison result information DCOM1 of a logic value "1" to the current detection unit 62A, in a case where the monitoring voltage VMON is higher than the reference voltage VREF1. In addition, the comparator COM1 outputs the comparison result information DCOM1 of a logic value "0" to the current detection unit 62A, in a case where the monitoring voltage VMON is equal to or lower than the reference voltage VREF1.

The comparator COM6 outputs the comparison result information DCOM6 of a logic value "1" to the current detection unit 62A, in a case where the monitoring voltage VMON is higher than the reference voltage VREF6. In addition, the comparator COM6 outputs the comparison result information DCOM6 of a logic value "0" to the current detection unit 62A, in a case where the monitoring voltage VMON is equal to or lower than the reference voltage VREF6.

The comparator COM7 outputs the comparison result information DCOM7 of a logic value "1" to the current detection unit 62A, in a case where the monitoring voltage VMON is higher than the reference voltage VREF7. In addition, the comparator COM7 outputs the comparison result information DCOM7 of a logic value "0" to the current detection unit 62A, in a case where the monitoring voltage VMON is equal to or lower than the reference voltage VREF7.

The control circuit 60B is the same as or similar to the control circuit 60A illustrated in FIG. 2, except for the number of bits of the comparison result information DCOM which is received from the comparison circuit 50A and the number of the control signals CNTE which is output to the differential transmission circuit 74. For example, the control circuit 60B includes a current detection unit 62A, a resistance calculation unit 64A, and a code calculation unit 66A.

The current detection unit 62A is the same as or similar to the current detection unit 62 illustrated in FIG. 2, except for the number of bits of the comparison result information DCOM which is received from the comparison circuit 50A and the number of the current information IST (ISTP1 to ISTP7, and ISTN1 to ISTN7) which is output to the resistance calculation unit 64A.

The resistance calculation unit 64A is the same as or similar to the resistance calculation unit 64 illustrated in FIG. 2, except for the number of the current information IST which is received from the current detection unit 62A and the number of the resistance information RMP (RMP1 to RMP7) and RMN (RMN1 to RMN7) which is output to the code calculation unit 66A. For example, the resistance calculation unit 64A calculates a value of the output resistance of the replica circuit 32 for each of eight levels of the monitoring voltage VMON, based on the current information IST received from the current detection unit 62A. In addition, the resistance calculation unit 64A outputs the resistance information RMP1 to RMP7 and RMN1 to RMN7 indicating the values of the output resistances of the replica circuit 32 which are calculated for each of the eight levels of the monitoring voltage VMON, to the code calculation unit 66A.

The code calculation unit 66A is the same as or similar to the code calculation unit 66 illustrated in FIG. 2, except for the number of the resistance information RMP and RMN which is received from the resistance calculation unit 64A and the number of the control signals CNTE which are output to the differential transmission circuit 74. For example, the code calculation unit 66A calculates the number of use of the respective drive circuits 80, 81, and 82 corresponding to each bit of the input data D with three bits, based on the resistance information RMP and RMN which is received from the resistance calculation unit 64A. In addition, the code calculation unit 66A generates the control signals CNTE (CNTEN0 to CNTEN2, and CNTEP0 to CNTEP2) which make the drive circuits 80, 81, and 82 of the same number as the calculated number of use enter a drivable state, and outputs the generated control signals CNTE to the differential transmission circuit 74.

A configuration the termination resistance adjustment circuit 20B is not limited to the example of FIG. 9. For example, the termination resistance adjustment circuit 20B may adjust a value of termination resistance of a transmission circuit which is generates the output signal DOUT by performing an amplitude modulation of the input data D with four bits or more. In a case where the number of bits of the input data D is m bits (m is an integer larger than "2" or more), for example, the voltage generation circuit 40A generates $2^m$ reference voltages VREF with the same interval as each other. In addition, the comparison circuit 50A compares each of $2^m$ reference voltages VREF with the monitoring voltage VMON, and outputs $2^m$ comparison result information DCOM to the control circuit 60B.

In a case where the reference voltages VREF corresponding to the values j (j=0, 1, . . . , $2^m-1$) of the input data D with m bits are referred to as VREFj, the comparison result information DCOM changes when the monitoring voltage VMON changes from a voltage higher than the reference voltage VREFj to a voltage equal to or lower than the reference voltage VREFj. Alternatively, the comparison result information DCOM changes when the monitoring voltage VMON changes from a voltage equal to or lower than the reference voltage VREFj to a voltage higher than the reference voltage VREFj.

The value of the control signal CNTIN is set to the current information ISTNi (i=$2^m-1-j$), when the monitoring voltage VMON changes from a voltage higher than the reference voltage VREFj (j=0, 1, . . . , $2^m-2$) to a voltage equal to or lower than the reference voltage VREFj. In addition, the value of the control signal CNTIN is set to the current information ISTPi (i=j), when the monitoring voltage VMON changes from a voltage equal to or lower than the reference voltage VREFj (j=$2^m-1$, $2^m-2$, . . . , 1) to a voltage higher than the reference voltage VREFj.

Load currents ILNi flowing through the output resistances RMPi (i=1, 2, . . . , $2^m-1$) of the replica circuit 32 at each output level of the monitoring voltage VMON are represented by "I0*ISTNi, using the current I0 per step of the control signals CNTIP and CNTIN. In addition, load currents ILPi flowing through the output resistances RMNi (i=1, 2, . . . , $2^m-1$) of the replica circuit 32 at each output level of the monitoring voltage VMON are represented by "I0*ISTPi.

In addition, the output resistances RMPi and RMNi (i=1, 2, . . . , $2^m-1$) are represented by Equation (15) and Equation (16), using the load currents ILNi (=I0*ISTNi) and ILPi (=I0*ISTPi).

$$RMPi=(3/4-i/(2*(2^m-1)))*VDD/ILNi \qquad (15)$$

$$RMNi=(3/4-i/(2*(2^m-1)))*VDD/ILPi \qquad (16)$$

For example, in a case where m=2, Equation (1) to Equation (6) illustrated in FIG. 6 are derived. In addition, in a case where m=3, the output resistances RMP1, RMP2, and RMP7 (an example of the output resistances RMP1 to RMP7) are represented by Equation (17), Equation (18), and Equation (19). The output resistances RMN1, RMN2, and RMN7 (an example of the output resistances RMN1 to RMN7) are represented by Equation (20), Equation (21), and Equation (22).

$$RMP1=19/28*VDD/ILN1 \qquad (17)$$

$$RMP2=17/28*VDD/ILN2 \qquad (18)$$

$$RMP7=7/28*VDD/ILN7 \qquad (19)$$

$$RMN1=19/28*VDD/ILP1 \qquad (20)$$

$$RMN2=17/28*VDD/ILP2 \qquad (21)$$

$$RMN7=7/28*VDD/ILP7 \qquad (22)$$

The number of use PTEk and NTEk (k=0, 1, . . . , m-1) of the drive circuits corresponding to each bit of the input data with m bits is represented by Equation (23) and Equation (24), in a case where the specified value of the termination resistance of the transmission circuit 76 is 50 CI.

$$PTEk=\Sigma(RMPx/(50*(2^m-1)*(2^{m-1-k}))) \qquad (23)$$

$$NTEk=\Sigma(RMNx/(50*(2^m-1)*(2^{m-1-k}))) \qquad (24)$$

x in the equation indicates a combination in which a kth bit (least significant bit is zeroth bit) is "1" when "i" of RMPi and RMNi is represented by a binary number. For example, in a case where m=3 and k=1, Equation (23) and Equation (24) add four values of x=111, 110, 011, and 010 (that is, i=7, 6, 3, and 2).

In a case where m=2, Equation (8), Equation (10), Equation (12), and Equation (14), which are illustrated in FIG. 6, are derived. In addition, in a case where m=3, the numbers of use PTEk and NTEk (k=0, 1, 2) of the drive circuits are respectively represented by Equation (25) to Equation (30).

$$PTE0=(RMP7+RMP5+RMP3+RMP1)/1400 \qquad (25)$$

$$PTE1=(RMP7+RMP6+RMP3+RMP2)/700 \qquad (26)$$

$$PTE2=(RMP7+RMP6+RMP5+RMP4)/350 \qquad (27)$$

$$NTE0=(RMN7+RMN5+RMN3+RMN1)/1400 \qquad (28)$$

$$NTE1=(RMN7+RMN6+RMN3+RMN2)/700 \qquad (29)$$

$$NTE2=(RMN7+RMN6+RMN5+RMN4)/350 \qquad (30)$$

Here, in a case where i of RMPi is represented by a binary number, an inverted value of each bit corresponds to the value of the input data D with m bits, and in a case where i of RMNi is represented by a binary number, a value of each bit corresponds to the value of each bit of the input data D with m bits. Hence, the number of use PTEk is calculated based on an average of the values of the output resistances RMP of a plurality of levels corresponding to each of the plurality of input patterns in which kth bit of the input data D with m bits becomes zero. In addition, the number of use NTEk is calculated based on an average of the values of the output resistances RMN of a plurality of levels corresponding to each of the plurality of input patterns in which kth bit of the input data D with m bits becomes one.

The code calculation unit 66A determines an integer closest to each of the numbers of use PTE0, PTE1, and PTE2 which are calculated based on, for example, Equation (25) to Equation (27), as the number (the numbers of use) of drive circuits 80, 81, and 82 which turn on transistor MP10. In addition, the code calculation unit 66A converts the determined number of use into a thermometer code, thereby generating the control signals CNTEP0, CNTEP1, and CNTEP2. In addition, the code calculation unit 66A determines an integer closest to each of the numbers of use NTE0, NTE1, and NTE2 which are calculated based on, for example, Equation (28) to Equation (30), as the number (the numbers of use) of drive circuits 80, 81, and 82 which turn on transistor MN10. In addition, the code calculation unit 66A converts the determined number of use into a thermometer code, thereby generating the control signals CNTEN0, CNTEN1, and CNTEN2.

As described above, it is possible to obtain the same effects as in the embodiments illustrated in FIG. 2 to FIG. 7, also in the embodiments illustrated in FIG. 8 and FIG. 9. For example, the termination resistance adjustment circuit 20B separately adjusts the number of use of the drive circuits 80, 81, and 82, based on the output resistances RMP1 to RMP7 and RMN1 to RMN7 which are calculated for each of a plurality of levels of the monitoring voltage VMON. Thereby, variation (variation depending on a change of the input pattern) of a ratio between the value of the combined resistance of the drive circuit 82, the value of the combined resistance of the drive circuit 81, and the value of combined resistance of the drive circuit 80, are reduce, compared to a case where the number of use of the drive circuits 80, 81, and 82 is adjusted based on one input pattern. Accordingly, it is possible to appropriately adjust the value of the termination resistance of the transmission circuit 76.

Meanwhile, adjustment of the aforementioned termination resistance value may be periodically (for each several minutes to several tens of minutes) performed even during an operation of products, so as to correspond to variation of a resistance value due to temperature change, in addition to the time of testing the products before shipping, periodically inspecting, supplying power, or the like.

Feature points and advantages of the embodiments will become apparent by the above detailed description. This means that the scope of claims extends to the feature points and advantages of the embodiments described above, in a range without departing from the spirit and the scope thereof. In addition, those skilled in the art will easily make all modifications and changes. Thus, the scope of the embodiments with inventiveness is not intended to limit to the above description, and can also include suitable modifications and equivalents within the range disclosed in the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A termination resistance adjustment circuit configured to adjust values of termination resistances of a transmission circuit including a plurality of drive circuits generating output signals with a plurality of voltage levels respectively corresponding to values of an input data with a plurality of bits, by adjusting the number of use of the drive circuits corresponding to each bit of the input data with the plurality of bits, the termination resistance adjustment circuit comprising:
    a replica circuit configured to include output resistances having the same characteristics as the termination resistances of the drive circuits;
    a current source configured to be able to adjust the amount of a load current which is supplied to an output terminal of the replica circuit;
    a voltage generation circuit configured to generate a plurality of reference voltages respectively corresponding to a plurality of values which are represented by the input data with the plurality of bits;
    a comparison circuit configured to compare a monitoring voltage which is output from the output terminal of the replica circuit with the plurality of reference voltages; and
    a control circuit configured to drive the replica circuit by setting an input signal of the replica circuit to any one of a first logic level and a second logic level, configured to change the amount of the load current by controlling the current source, configured to calculate values of the output resistances of the replica circuit for each of a plurality of levels of the monitoring voltage, based on the amount of the load current at when a comparison result by the comparison circuit changes, configured to adjust the number of use of the drive circuits for each bit of the input data with the plurality of bits, based on the values of the output resistances which are calculated for each of the plurality of levels, so that the values of the termination resistances of the transmission circuit are adjusted.

2. The termination resistance adjustment circuit according to claim 1, wherein the control circuit separately controls a value of first termination resistance that is connected to a power supply line to which a power supply voltage is supplied and a value of second termination resistance that is connected to a ground line to which a ground voltage is supplied, among the termination resistances of the transmission circuit.

3. The termination resistance adjustment circuit according to claim 2,
    wherein the control circuit sets the input signal of the replica circuit to a first logic level, changes the amount of the load current that is pulled out from the output terminal of the replica circuit by controlling the current source, calculates a first resistance value of the output resistances of the replica circuit for each of the plurality of levels of the monitoring voltage, based on the amount of the load current when comparison results of the comparison circuit change, adjusts the number of use of the drive circuits that are driven in a case where a signal with the first logic level is received, for each bit of the input data with a plurality of bits, based on the first resistance value, so that the value of the first termination resistance is adjusted, and
    wherein the control circuit sets the input signal of the replica circuit to a second logic level, changes the amount of the load current that is flows into the output terminal of the replica circuit by controlling the current source, calculates a second resistance value of the output resistances of the replica circuit for each of the plurality of levels of the monitoring voltage, based on the amount of the load current when the comparison results of the comparison circuit change, adjusts the number of use of the drive circuits that are driven in a case where a signal with the second logic level is received, for each bit of the input data with a plurality of bits, based on the second resistance value, so that the value of the second termination resistance is adjusted.

4. The termination resistance adjustment circuit according to claim 3,
    wherein the control circuit adjusts the value of the first termination resistance by adjusting the number of use of the drive circuits that are driven in a case where the signal with the first logic level is received, among the number of use of the drive circuits of bits of the adjustment target, based on an average of the first resistance values of the plurality of levels respectively corresponding to a plurality of input patterns in which the bits of the adjustment target are the first logic level, among the input data with the plurality of bits, and
    wherein the control circuit adjusts the value of the second termination resistance by adjusting the number of use of the drive circuits that are driven in a case where the signal with the second logic level is received, among the number of use of the drive circuits of bits of the adjustment target, based on an average of the second resistance values of the plurality of levels respectively corresponding to a plurality of input patterns in which the bits of the adjustment target are the second logic level, among the input data with the plurality of bits.

5. The termination resistance adjustment circuit according to claim 1, wherein the voltage generation circuit generates $2^m$ reference voltages with the same interval as each other as the plurality of reference voltages, in a case where the number of bits of the input data with the plurality of bits is m bits (m is an integer equal to or larger than "2").

6. The termination resistance adjustment circuit according to claim 5, wherein the comparison circuit compares each of the $2^m$ reference voltages with the monitoring voltage, and outputs $2^m$ comparison results to the control circuit.

7. A device comprising:
- a transmission circuit configured to include a plurality of drive circuits that generate output signals with a plurality of voltage levels respectively corresponding to values of input data with a plurality of bits; and
- a termination resistance adjustment circuit configured to adjust values of termination resistances of the transmission circuit by adjusting the number of use of the drive circuits corresponding to each bit of the input data with the plurality of bits,
- wherein the termination resistance adjustment circuit including
- a replica circuit configured to include output resistances having the same characteristics as the termination resistances of the drive circuits;
- a current source configured to be able to adjust the amount of a load current which is supplied to an output terminal of the replica circuit;
- a voltage generation circuit configured to generate a plurality of reference voltages respectively corresponding to a plurality of values which are represented by the input data with the plurality of bits;
- a comparison circuit configured to compare a monitoring voltage which is output from the output terminal of the replica circuit with the plurality of reference voltages; and
- a control circuit configured to drive the replica circuit by setting an input signal of the replica circuit to any one of a first logic level and a second logic level, configured to change the amount of the load current by controlling the current source, configured to calculate values of the output resistances of the replica circuit for each of a plurality of levels of the monitoring voltage, based on the amount of the load current at when a comparison result by the comparison circuit changes, configured to adjust the number of use of the drive circuits for each bit of the input data with the plurality of bits, based on the values of the output resistances which are calculated for each of the plurality of levels, so that the values of the termination resistances of the transmission circuit are adjusted.

\* \* \* \* \*